US012757602B2

(12) United States Patent
Ko et al.

(10) Patent No.: US 12,757,602 B2
(45) **Date of Patent: *Oct. 6, 2026**

(54) DISPLAY PANEL AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Youngyik Ko, Beijing (CN); Chi Yu, Beijing (CN); Wei Zhang, Beijing (CN); Yu Zhang, Beijing (CN); Weiyun Huang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 195 days.

This patent is subject to a terminal disclaimer.

(21) Appl. No.: 18/628,541

(22) Filed: Apr. 5, 2024

(65) Prior Publication Data

US 2024/0251597 A1 Jul. 25, 2024

Related U.S. Application Data

(63) Continuation of application No. 17/280,692, filed as application No. PCT/CN2020/088328 on Apr. 30, 2020, now Pat. No. 11,985,853.

(51) Int. Cl.
*H10K 59/35* (2023.01)
*H10K 59/121* (2023.01)
(Continued)

(52) U.S. Cl.
CPC ......... *H10K 59/351* (2023.02); *H10K 59/121* (2023.02); *H10K 59/122* (2023.02);
(Continued)

(58) Field of Classification Search
CPC .. H10K 59/351; H10K 59/121; H10K 59/122; H10K 59/65; H10K 59/1201; H10K 59/8723
(Continued)

(56) References Cited

U.S. PATENT DOCUMENTS 11,263,968 B2 * 3/2022 Wang .................. G09G 3/3258
11,985,853 B2 * 5/2024 Ko ....................... H10K 59/122
(Continued)

FOREIGN PATENT DOCUMENTS

CN 106449717 A 2/2017
CN 110310576 A 10/2019
(Continued)

OTHER PUBLICATIONS

Wang, Display Substrate and Driving Method Therefor, and Display Device, Published Dec. 26, 2019 ( English translation of WO 2019/242510 by PE2E) (Year: 2019).*
(Continued)

*Primary Examiner* — Tu-Tu V Ho
(74) *Attorney, Agent, or Firm* — Kinney & Lange, P.A.

(57) ABSTRACT

A display panel is provided, including: a pixel defining layer including a first opening in a first display area and a second opening in a second display area; first repeating units in the first display area, each first repeating unit including at least a first sub-pixel; second repeating units in the second display area, each second repeating unit including at least a second sub-pixel, a color of light emitted by which is the same as that of light emitted by the first sub-pixel. A distribution density of the first repeating units is greater than that of the
(Continued)

second repeating units. The first sub-pixel includes the first opening, the second sub-pixel includes the second opening, and an area of an orthographic projection of the second opening on the base substrate is greater than that of an orthographic projection of the first opening on the base substrate.

25 Claims, 17 Drawing Sheets

(51) Int. Cl.

| | |
|---|---|
| ***H10K 59/122*** | (2023.01) |
| ***H10K 59/80*** | (2023.01) |
| *H10K 59/12* | (2023.01) |
| *H10K 59/65* | (2023.01) |

(52) U.S. Cl.
CPC ..... *H10K 59/8723* (2023.02); *H10K 59/1201* (2023.02); *H10K 59/65* (2023.02)

(58) Field of Classification Search
USPC ........................................................ 257/40
See application file for complete search history.

(56) References Cited

U.S. PATENT DOCUMENTS

| | | | |
|---|---|---|---|
| 2018/0005561 A1 | 1/2018 | Moon et al. | |
| 2020/0066809 A1 | 2/2020 | Liu | |
| 2020/0203450 A1 | 6/2020 | Lou et al. | |
| 2021/0065625 A1 | 3/2021 | Wang et al. | |
| 2021/0066409 A1 | 3/2021 | Fan | |
| 2021/0141304 A1 | 5/2021 | Liu et al. | |
| 2021/0241671 A1 | 8/2021 | Lee et al. | |
| 2021/0376011 A1 | 12/2021 | Liu et al. | |
| 2022/0037423 A1 | 2/2022 | Zhang | |
| 2022/0271101 A1* | 8/2022 | Bing | H10K 59/353 |

FOREIGN PATENT DOCUMENTS

| | | |
|---|---|---|
| CN | 110379836 A | 10/2019 |
| CN | 110504289 A | 11/2019 |
| CN | 110764362 A | 2/2020 |
| CN | 110767702 A | 2/2020 |
| CN | 110783385 A | 2/2020 |
| CN | 110838505 A | 2/2020 |
| CN | 110914891 A | 3/2020 |
| WO | 2019242510 A1 | 12/2019 |

OTHER PUBLICATIONS

Extended European Search Report dated May 24, 2023, for corresponding European Application No. 20904265.4.

International Search Report and Written Opinion dated Jan. 13, 2021, for corresponding PCT Application No. PCT/CN2020/088328.

Non-Final Office Action dated Aug. 10, 2023, for parent U.S. Appl. No. 17/280,692.

Notice of Allowance dated Feb. 7, 2024, for parent U.S. Appl. No. 17/280,692., Aug. 10, 2023.

Office Action dated Nov. 25, 2024, for corresponding Chinese Patent Application No. 202080000662.2.

* cited by examiner

DISPLAY PANEL AND DISPLAY DEVICE

CROSS-REFERENCE TO RELATED APPLICATION(S)

This application is a continuation of U.S. application Ser. No. 17/280,692, filed Mar. 26, 2021, entitled "DISPLAY PANEL AND DISPLAY DEVICE", which is a Section 371 National Stage Application of International Application No. PCT/CN2020/088328, filed on Apr. 30, 2020, entitled "DISPLAY PANEL AND DISPLAY DEVICE", which are incorporated herein by reference in their entirety.

TECHNICAL FIELD

The present disclosure relates to the field of display technology, in particular to a display panel and a display device.

BACKGROUND

With an increase of demands for diversified use of display devices by users and an emergence of design requirements for high screen-to-body ratio of display devices, an "under-screen camera" solution is proposed. In the "under-screen camera" solution, imaging modules such as cameras are embedded in a display area to reduce a size of a frame area of the display device, thereby increasing the screen-to-body ratio. At present, in order to increase the screen-to-body ratio of a display device using such an "under-screen camera" solution, recent research and development have been directed toward ensuring the light transmittance and display effect at a position corresponding to the imaging module in the display panel.

The above information disclosed in this section is only used for the understanding of the background of a technical concept of the present disclosure, therefore, the above information may include information that is not included in the prior art.

SUMMARY

In one aspect, a display panel is provided. The display panel comprises a first display area and a second display area, wherein the display panel comprises: a base substrate; a plurality of first repeating units, wherein the plurality of first repeating units are arranged on the base substrate in an array in a row direction and a column direction and are located in the first display area, and each of the first repeating units comprises at least a first sub-pixel; a plurality of second repeating units, wherein the plurality of second repeating units are arranged on the base substrate in an array in the row direction and the column direction and are located in the second display area, each of the second repeating units comprises at least a second sub-pixel, and a color of light emitted by the first sub-pixel is the same as a color of light emitted by the second sub-pixel; a pixel defining layer, wherein the pixel defining layer is disposed on the base substrate and located in both the first display area and the second display area, and the pixel defining layer comprises a first opening located in the first display area and a second opening located in the second display area, wherein a distribution density of the first repeating units in the first display area is greater than a distribution density of the second repeating units in the second display area; and wherein the first sub-pixel comprises the first opening, the second sub-pixel comprises the second opening, and an area of an orthographic projection of the second opening on the base substrate is greater than an area of an orthographic projection of the first opening on the base substrate.

According to some exemplary embodiments, the pixel defining layer further comprises a third opening in the first display area and a fourth opening in the second display area; each of the first repeating units further comprises a third sub-pixel, each of the second repeating units further comprises a fourth sub-pixel, a color of light emitted by the third sub-pixel is the same as a color of light emitted by the fourth sub-pixel, and the color of the light emitted by the third sub-pixel is different from the color of the light emitted by the first sub-pixel; and the third sub-pixel comprises the third opening, the fourth sub-pixel comprises the fourth opening, and an area of an orthographic projection of the fourth opening on the base substrate is greater than an area of an orthographic projection of the third opening on the base substrate.

According to some exemplary embodiments, the pixel defining layer further comprises a fifth opening in the first display area and a sixth opening in the second display area; each of the first repeating units further comprises a fifth sub-pixel, each of the second repeating units further comprises a sixth sub-pixel, a color of light emitted by the fifth sub-pixel is the same as a color of light emitted by the sixth sub-pixel, and the color of the light emitted by the fifth sub-pixel, the color of the light emitted by the first sub-pixel, and the color of the light emitted by the third sub-pixel are different from each other; and the fifth sub-pixel comprises the fifth opening, the sixth sub-pixel comprises the sixth opening, and an area of an orthographic projection of the sixth opening on the base substrate is greater than an area of an orthographic projection of the fifth opening on the base substrate.

According to some exemplary embodiments, the pixel defining layer further comprises a fifth opening and a seventh opening which are both located in the first display area, and a sixth opening located and an eighth opening which are both located in the second display area; each of the first repeating units further comprises a fifth sub-pixel and a seventh sub-pixel, each of the second repeating units further comprises a sixth sub-pixel and an eighth sub-pixel, colors of light emitted by the fifth sub-pixel, the sixth sub-pixel, the seventh sub-pixel, and the eighth sub-pixel are the same as each other, and the color of the light emitted by the fifth sub-pixel, the color of the light emitted by the first sub-pixel, and the color of the light emitted by the third sub-pixel are different from each other; and the fifth sub-pixel comprises the fifth opening, the sixth sub-pixel comprises the sixth opening, the seventh sub-pixel comprises the seventh opening, and the eighth sub-pixel comprises the eighth opening, a sum of areas of orthographic projections of the sixth opening and the eighth opening on the base substrate is greater than a sum of areas of orthographic projections of the fifth opening and the seventh opening on the base substrate.

According to some exemplary embodiments, the orthographic projection of each of the first opening, the second opening, the third opening, the fourth opening, the fifth opening, and the sixth opening on the base substrate is in a shape of a rectangle, and the rectangle has a first size in the row direction and a second size in the column direction; and the first size of the second opening is greater than the first size of the first opening and the second size of the second opening is greater than the second size of the first opening; and/or, the first size of the fourth opening is greater than the first size of the third opening and the second size of the fourth opening is greater than the second size of the third opening; and/or, the first size of the sixth opening is greater than the first size of the fifth opening and the second size of the sixth opening is greater than the second size of the fifth opening.

According to some exemplary embodiments, the orthographic projection of each of the first opening, the second opening, the third opening, and the fourth opening on the base substrate is in a shape of a hexagon, and the hexagon has a first size in the row direction and a second size in the column direction; and the first size of the second opening is greater than the first size of the first opening and the second size of the second opening is greater than the second size of the first opening; and/or, the first size of the fourth opening is greater than the first size of the third opening and the second size of the fourth opening is greater than the second size of the third opening.

According to some exemplary embodiments, the orthographic projection of each of the fifth opening, the sixth opening, the seventh opening, and the eighth opening on the base substrate is in a shape of a pentagon, and the pentagon has a first size in the row direction and a second size in the column direction; and a sum of the first size of the sixth opening and the first size of the eighth opening is greater than a sum of the first size of the fifth opening and the first size of the seventh opening, and a sum of the second size of the sixth opening and the second size of the eighth opening is greater than a sum of the second size of the fifth opening and the second size of the seventh opening.

According to some exemplary embodiments, in two adjacent rows of second repeating units, one second repeating unit in one row and another second repeating unit which is located in the other row and adjacent to the one second repeating unit are spaced apart from each other in the row direction, by a spacing distance that is substantially equal to a size of one first repeating unit in the row direction.

According to some exemplary embodiments, in the same row of second repeating units, two adjacent second repeating units are spaced apart from each other in the row direction, by a spacing distance that is substantially equal to a size of three first repeating units in the row direction.

According to some exemplary embodiments, in one of the second repeating units, the sixth sub-pixel and the eighth sub-pixel are located in the same column and are arranged on both sides of the fourth sub-pixel in the column direction, the second sub-pixel, the fourth sub-pixel, and the sixth sub-pixel are sequentially arranged in the row direction, the second sub-pixel and the sixth sub-pixel are located in the same row, and the second sub-pixel, the fourth sub-pixel, and the eighth sub-pixel are sequentially arranged in the column direction.

According to some exemplary embodiments, in one of the second repeating units, the sixth sub-pixel and the eighth sub-pixel are located in the same column, and are arranged on the same side of the fourth sub-pixel in the column direction, the sixth sub-pixel and the eighth sub-pixel are spaced apart from each other in the column direction, the sixth sub-pixel and the eighth sub-pixel are arranged on the same side of the second sub-pixel in the row direction, the second sub-pixel, the fourth sub-pixel, and the sixth sub-pixel are sequentially arranged in the row direction, and a combination of the sixth sub-pixel and the eight sub-pixel is located in the same row as the second sub-pixel, and the fourth sub-pixel and the second sub-pixel are sequentially arranged in the column direction.

According to some exemplary embodiments, the pixel defining layer further comprises a fifth opening and a seventh opening which are both located in the first display area, and a sixth opening located in the second display area; each of the first repeating units further comprises a fifth sub-pixel and a seventh sub-pixel, each of the second repeating units further comprises a sixth sub-pixel, colors of light emitted by the fifth sub-pixel, the sixth sub-pixel and the seventh sub-pixel are the same as each other, and the color of light emitted by the fifth sub-pixel, the color of the light emitted by the first sub-pixel, and the color of the light emitted by the third sub-pixel are different from each other; and the fifth sub-pixel comprises the fifth opening, the sixth sub-pixel comprises the sixth opening, the seventh sub-pixel comprises the seventh opening, and an area of an orthographic projection of the sixth opening on the base substrate is greater than a sum of areas of orthographic projections of the fifth opening and the seventh opening on the base substrate.

According to some exemplary embodiments, in one of the first repeating units, the fifth sub-pixel and the seventh sub-pixel are located in the same column, and the fifth opening and the seventh opening located in the same column are spaced apart from each other in the column direction; the pixel defining layer further comprises a portion between the fifth opening and the seventh opening in the column direction; the area of the orthographic projection of the sixth opening on the base substrate is greater than a sum of areas of orthographic projections of the fifth opening, the seventh opening, and the portion of the pixel defining layer between the fifth opening and the seventh opening on the base substrate.

According to some exemplary embodiments, two adjacent rows of second repeating units are spaced apart in the column direction by a spacing distance that is equal to a size of one second repeating unit in the column direction.

According to some exemplary embodiments, in one of the second repeating units, the second sub-pixel, the sixth sub-pixel, and the fourth sub-pixel are located in the same row and are arranged in sequence in the row direction.

According to some exemplary embodiments, in a plurality of first repeating units arranged close to an edge of the second display area, a structure which is recessed relative to the adjacent first sub-pixel and the adjacent third sub-pixel is formed at the fifth sub-pixel.

According to some exemplary embodiments, each of the first repeating units further comprises a fifth sub-pixel and a seventh sub-pixel, and each of the second repeating units further comprises a sixth sub-pixel; the display panel further comprises a plurality of third repeating units, the third repeating units are arranged on the base substrate in an array in the row direction and the column direction, and are located in the second display area, each of the third repeating unit comprises a fourth sub-pixel and an eighth sub-pixel; the distribution density of the first repeating units is greater than a distribution density of the third repeating units; and a row where the second repeating units are located and a row where the third repeating units are located are alternately arranged in the column direction, and a column where the second repeating units are located and a column where the third repeating units are located are spaced apart in the row direction by a spacing distance that is substantially equal to a size of one first repeating unit in the row direction.

According to some exemplary embodiments, the pixel defining layer further comprises a third opening, a fifth opening, and a seventh opening which are all located in the first display area, and a fourth opening, a sixth opening and an eighth opening which are all located in the second display area; the third sub-pixel comprises the third opening, the fourth sub-pixel comprises the fourth opening, the fifth sub-pixel comprises the fifth opening, the sixth sub-pixel comprises the sixth opening, the seventh sub-pixel comprises the seventh opening, and the eighth sub-pixel comprises the eighth opening; and an area of an orthographic projection of the fourth opening on the base substrate is greater than an area of an orthographic projection of the third opening on the base substrate, and an area of an orthographic projection of the sixth opening on the base substrate is greater than an area of an orthographic projection of the fifth opening on the base substrate, and an area of an orthographic projection of the eighth opening on the base substrate is greater than an area of an orthographic projection of the seventh opening on the base substrate.

According to some exemplary embodiments, the first size of the second opening is $(1+n_1)$ times the first size of the first opening, and the second size of the second opening is $(1+n_1)$ times the second size of the first opening; and the first size of the fourth opening is $(1+n_2)$ times the first size of the third opening, and the second size of the fourth opening is $(1+n_2)$ times the second size of the third opening; wherein $n_1$ and $n_2$ are both greater than zero.

According to some exemplary embodiments, the first size of the sixth opening is $(1+n_3)$ times the first size of the fifth opening, and the second size of the sixth opening is $(1+n_3)$ times the second size of the fifth opening; or a sum of the first size of the sixth opening and the first size of the eighth opening is $(1+n_3)$ times a sum of the first size of the fifth opening and the first size of the seventh opening, and a sum of the second size of the sixth opening and the second size of the eighth opening is $(1+n_3)$ times a sum of the second size of the fifth opening and the second size of the seventh opening, wherein $n_3$ is greater than zero.

According to some exemplary embodiments, $n_1$, $n_2$ and n, are all less than or equal to 30%.

According to some exemplary embodiments, $n_1$, $n_2$ and n, are all less than or equal to 9%.

According to some exemplary embodiments, $n_1$, $n_2$ and $n_3$ are equal to each other; or $n_1$, $n_2$ and $n_3$ are not equal to each other.

According to some exemplary embodiments, each sub-pixel comprises: an anode between the base substrate and the pixel defining layer; and a light-emitting layer on a side of the pixel defining layer away from the base substrate, wherein each of the first opening and the second opening exposes a part of the anode, and a part of the light-emitting layer is filled in each of the first opening and the second opening to contact an exposed part of the anode.

According to some exemplary embodiments, in one of the second repeating units, a minimum distance between edges of openings of two adjacent sub-pixels is greater than 4 microns.

According to some exemplary embodiments, the display panel further comprises a plurality of spacers, wherein the plurality of spacers comprise first spacers in the first display area and second spacers in the second display area, and a distribution density of the first spacers is greater than a distribution density of the second spacers.

According to some exemplary embodiments, the distribution density of the second spacers is ⅙ to ½ of the distribution density of the first spacers.

According to some exemplary embodiments, the second spacers comprise a first sub-spacer and a second sub-spacer, the first sub-spacer is arranged between the second sub-pixel and the sixth sub-pixel, and the second sub-spacer is arranged on a side of the fourth sub-pixel and located in a column where the second sub-pixels are located in the column direction; or the first sub-spacer is arranged between the second sub-pixel and a combination of the sixth sub-pixel and the eighth sub-pixel, the second sub-spacer is arranged on a side of the fourth sub-pixel and is located in a column where the combination of the sixth sub-pixel and the eighth sub-pixel is located in the column direction.

According to some exemplary embodiments, in an oblique column direction at an oblique angle with respect to the column direction, the second spacers in the same oblique column are all one kind of the first sub-spacer and the second sub-spacer; and in two adjacent oblique columns of second spacers, one column comprises the first sub-spacers, and the other column comprises the second sub-spacers.

According to some exemplary embodiments, the colors of the light emitted by the first sub-pixel, the third sub-pixel, and the fifth sub-pixel are red, blue, and green, respectively.

According to some exemplary embodiments, the color of the light emitted by the first sub-pixel is red, the color of the light emitted by the third sub-pixel is blue, and the colors of the light emitted by the fifth sub-pixel and the seventh sub-pixel are both green.

In another aspect, a display device is provided, comprising: the display panel as described above; and an image sensor, wherein the image sensor is located on a side of the base substrate away from the pixel defining layer, and an orthographic projection of the image sensor on the base substrate is located within an orthographic projection of the second display area on the base substrate.

BRIEF DESCRIPTION OF THE DRAWINGS

By describing in detail exemplary embodiments of the present disclosure with reference to accompanying drawings, features and advantages of the present disclosure will become more apparent.

DETAILED DESCRIPTION OF EMBODIMENTS

Figure 1:
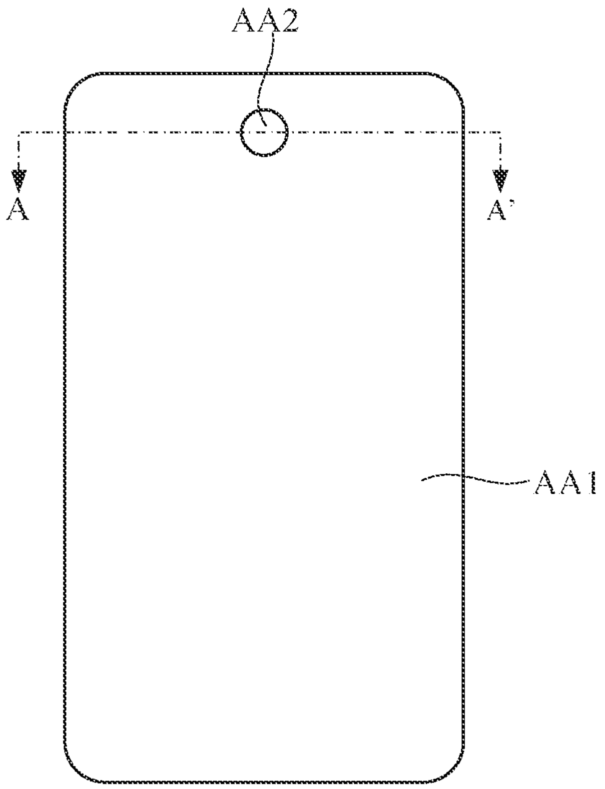
FIG. 1 is a schematic plan view of a display panel according to some exemplary embodiments of the present disclosure.

In order to make objectives, technical solutions, and advantages of the embodiments of the present disclosure clearer, technical solutions of the embodiments of the present disclosure will be described clearly and completely in conjunction with the accompanying drawings. Obviously, the described embodiments are a part of the embodiments of the present disclosure, rather than all of the embodiments. Based on the described embodiments of the present disclosure, all other embodiments obtained by those skilled in the art without creative work shall be included in the protection scope of the present disclosure.

It should be noted that, in the drawings, for clarity and/or description purposes, sizes and relative sizes of elements may be enlarged. As such, the size and relative size of each element may not be necessarily limited to those shown in the drawings. In the specification and drawings, the same or similar reference numerals indicate the same or similar components.

When an element is described as being "on", "connected" or "coupled" to another element, the element may be directly contacting the another element, directly connected to the another element, or directly coupled to the another element, or there may be an intervening element between the element and the another element. However, when an element is described as being "directly on", "directly connected" or "directly coupled" to another element, there are no intervening elements. Other terms and/or expressions used to describe the relationship between elements should be interpreted in a similar manner, for example, "between" versus "directly between", "adjacent" versus "directly adjacent", or "above" versus "directly above", etc. In addition, the term "connection" may refer to a physical connection, an electrical connection, a communication connection, and/or a fluid connection. In addition, the X axis, the Y axis, and the Z axis are not limited to the three axes of the Cartesian coordinate system, and they may be interpreted in a broader meaning. For example, the X axis, the Y axis, and the Z axis may be perpendicular to each other, or may represent different directions that are not perpendicular to each other. For the purpose of the present disclosure, "at least one of X, Y, and Z" and "at least one selected from groups consisting of X, Y, and Z" may be interpreted as only X, only Y, only Z, or any combination of two or more of X, Y, and Z, such as XYZ, XYY, YZ, and ZZ. As used herein, the term "and/or" includes any and all combinations of one or more of the listed related items.

It should be noted that although the terms "first", "second" and the like are used herein to describe various components, members, elements, regions, layers and/or parts, these components, members, elements, regions, and layers and/or parts should not be limited by these terms. Rather, these terms are used to distinguish one component, member, element, region, layer, and/or part from another component, member, element, region, layer, and/or part. Thus, for example, the first component, the first member, the first element, the first region, the first layer and/or the first part discussed below may be referred to as the second component, the second member, the second element, the second region, the second layer and/or the second part without departing from the teachings of the present disclosure.

For ease of description, spatial relationship terms, for example, "up", "down", "left", "right", and the like, may be used herein to describe the relationship between one element or feature and another element or feature as shown in the drawings. It should be understood that the spatial relationship terms are intended to cover other different orientations of the device in use or in operation in addition to orientations described in the drawings. For example, if the device in the drawings is turned upside down, elements described as "below" or "beneath" other elements or features would be oriented "on" or "above" the other elements or features.

In this context, an expression "repeating unit" means a combination of multiple sub-pixels, for example, a combination of multiple sub-pixels used to display one pixel dot, and a plurality of "repeating units" are repeatedly arranged in an array on a base substrate. For example, one repeating unit may include 2, 3, 4, or more sub-pixels. In addition, in this context, for the convenience of description, the repeating unit in the first display area is referred to as a first repeating unit, and the repeating unit in the second display area is referred to as a second repeating unit.

In this context, an expression "pixel density" refers to the number of repeating units or sub-pixels per unit area. Similarly, an expression "distribution density" refers to the number of components (such as repeating units, sub-pixels, spacers, etc.) per unit area.

Embodiments of the present disclosure provide a display panel, the display panel comprising a first display area and a second display area, wherein the display panel comprises: a base substrate; a plurality of first repeating units, wherein the plurality of first repeating units are arranged on the base substrate in an array in a row direction and a column direction and are located in the first display area, and each of the first repeating units comprises at least a first sub-pixel; a plurality of second repeating units, wherein the plurality of second repeating units are arranged on the base substrate in an array in the row direction and the column direction and are located in the second display area, each of the second repeating units comprises at least a second sub-pixel, and a color of light emitted by the first sub-pixel is the same as a color of light emitted by the second sub-pixel; a pixel defining layer, wherein the pixel defining layer is disposed on the base substrate and located in both the first display area and the second display area, and the pixel defining layer comprises a first opening located in the first display area and a second opening located in the second display area, wherein a distribution density of the first repeating units in the first display area is greater than a distribution density of the second repeating units in the second display area; and wherein the first sub-pixel comprises the first opening, the second sub-pixel comprises the second opening, and an area of an orthographic projection of the second opening on the base substrate is greater than an area of an orthographic projection of the first opening on the base substrate. In this way, display uniformity between the first display area and the second display area can be improved, and uniformity of lifetime of luminescent materials in the first display area and in the second display area may also be improved.

Figure 2:
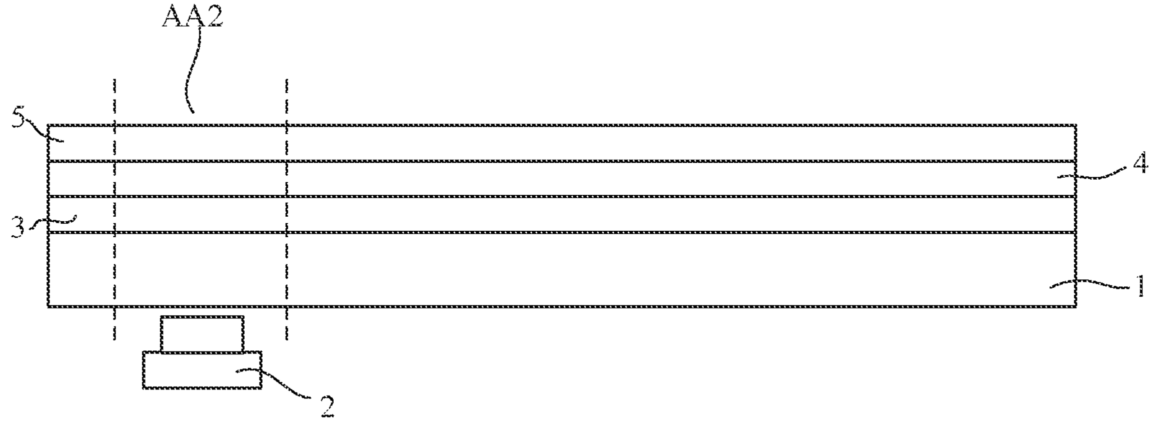
FIG. 2 is a schematic cross-sectional view of a display panel according to some exemplary embodiments of the present disclosure taken along line AA' in FIG. 1.
Figure 3:
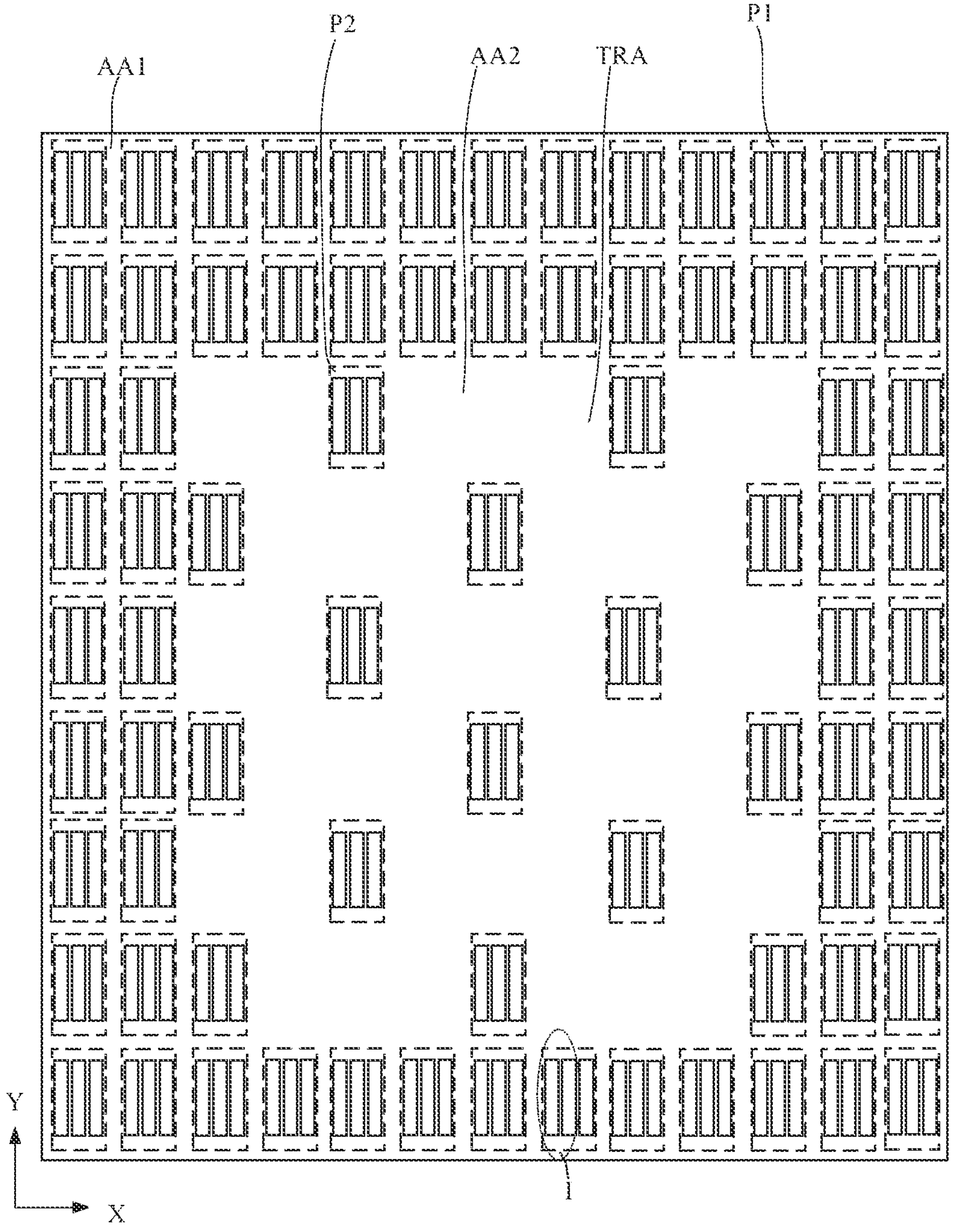
FIG. 3 is a partial enlarged schematic view of the display panel in FIG. 1, wherein each dashed frame represents a repeating unit, and each rectangle represents a sub-pixel.

FIG. 1 is a schematic plan view of a display panel according to some exemplary embodiments of the present disclosure. FIG. 2 is a schematic cross-sectional view of a display panel according to some exemplary embodiments of the present disclosure taken along line AA' in FIG. 1. FIG. 3 is a partial enlarged schematic view of the display panel in FIG. 1. In the drawing, each dashed frame represents a repeating unit, and each rectangle represents a sub-pixel.

Referring to FIGS. 1 to 3, the display panel includes a first display area AA1 and a second display area AA2 at least partially surrounded by the first display area AA1. The first display area AA1 includes a plurality of first repeating units P1 arranged in an array, and the second display area AA2 includes a plurality of second repeating units P2 arranged in an array. The first repeating unit P1 may further include a plurality of sub-pixels, such as red sub-pixel, green sub-pixel, and blue sub-pixel; similarly, the second repeating unit P2 may further include a plurality of sub-pixels, such as red sub-pixel, green sub-pixel, and blue sub pixel.

It should be noted that the embodiments of the present disclosure are described by taking red, green, and blue as examples. However, the embodiments of the present disclosure are not limited to this, that is, each repeating unit may include a sub-pixel of first color, a sub-pixel of second color and a sub-pixel of third color, and the first color, the second color, and the third color are different from each other. In this context, for the convenience of description, the sub-pixels included in the first repeating unit P1 are respectively referred to as a first sub-pixel, a third sub-pixel, and a fifth sub-pixel, and the sub-pixels included in the second repeating unit P2 are respectively referred to as a second sub-pixel, a fourth sub-pixel, and a sixth sub-pixel. For example, the first sub-pixel and the second sub-pixel can be red sub-pixel, the third sub-pixel and the fourth sub-pixel can be blue sub-pixel, and the fifth sub-pixel and the sixth sub-pixel can be green sub-pixel. However, the embodiments of the present disclosure are not limited to this. In other embodiments, each repeating unit may include four sub-pixels. For example, the first repeating unit P1 may include a first sub-pixel, a third sub-pixel, and a fifth sub-pixel and a seventh sub-pixel, the second repeating unit P2 may include a second sub-pixel, a fourth sub-pixel, a sixth sub-pixel, and an eighth sub-pixel. For example, two sub-pixels of the four sub-pixels included in each repeating unit may constitute one pixel unit, and the other two sub-pixels of the four sub-pixels included in each repeating unit may constitute another pixel unit, that is, each repeating unit may include two pixel units.

It should be noted that in the illustrated exemplary embodiments, the first display area AA1 surrounds the second display area AA2, but the embodiment of the present disclosure is not limited to this. For example, in other embodiments, the second display area AA2 can be located at upper edge of the display panel. For example, three sides of the second display area AA2 are surrounded by the first display area AA1, and its upper side is flush with the upper edge of the display panel. For another example, the second display area AA2 can be located at the upper edge of the display panel and arranged along the entire width of the display panel.

As shown in FIG. 3, the first display area AA1 has a first pixel density, and the second display area AA2 has a second pixel density smaller than the first pixel density.

In the second display area AA2, a blank area between any two ones of the second repeating units P2 may allow more light to pass through, thereby increasing the light transmittance of the area. Therefore, compared with the first display area AA1, the second display area AA2 has a greater light transmittance.

It should be noted that, in this context, the blank area between any two ones of the second repeating units P2 can be referred to as a light-transmitting area TRA.

As shown in FIG. 2, the display panel may include a base substrate 1. The image sensor 2 can be arranged on the back of the base substrate 1 (the lower side shown in FIG. 2) located in the second display area AA2, and the second display area AA2 may meet imaging requirements of the image sensor 2 for light transmittance.

In the display panels shown in FIGS. 1 to 3, OLED display technology can be used. As OLED display panels have advantages of wide viewing angle, high contrast, fast response, low power consumption, foldability, flexibility, etc., they are being used more and more widely in display products. With the development and in-depth application of OLED display technology, the demand for high screen-to-body ratio is becoming stronger. In the display panels shown in FIGS. 1 to 3, an under-screen camera solution is adopted. In this way, a notch area can be eliminated, so that it is not necessary to dig holes in the display screen. Thus, the screen-to-body ratio can be increased and a better visual experience is provided.

In addition, the display panel may further include a driving circuit layer, a light-emitting device layer, and an encapsulation layer provided on the base substrate 1. For example, the driving circuit layer 3, the light-emitting device layer 4, and the encapsulation layer 5 are schematically shown in FIG. 2. The driving circuit layer 3 includes a driving circuit structure, and the light-emitting device layer 4 includes a light-emitting device such as an OLED. The driving circuit structure controls the light-emitting device of each sub-pixel to emit light to realize the display function. The driving circuit structure includes thin film transistors, storage capacitors, and various signal lines. The various signal lines include gate lines, data lines, ELVDD power lines, ELVSS power lines, etc., so as to provide various signals such as control signals, data signals, and power supply voltages for the pixel driving circuit in each sub-pixel.

Figure 4:
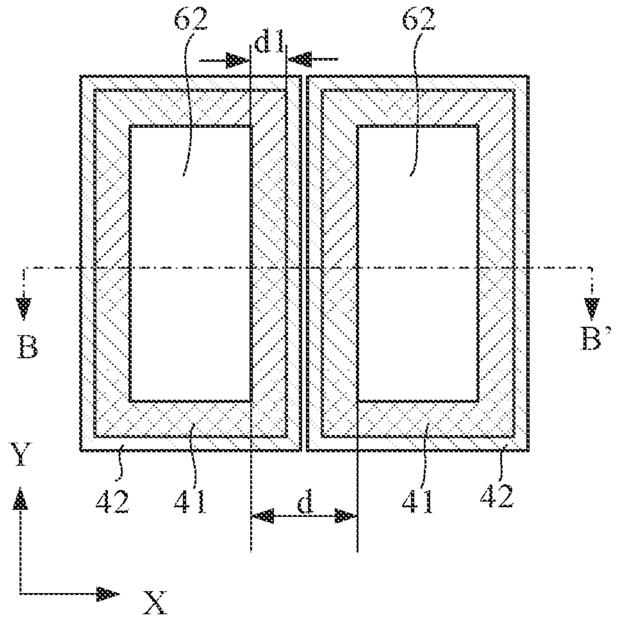
FIG. 4 is a partial enlarged schematic view of part I in FIG. 3.
Figure 5:
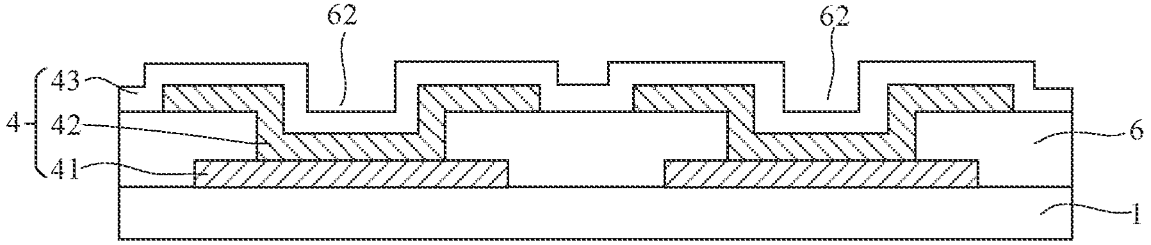
FIG. 5 is a schematic cross-sectional view taken along line BB' in FIG. 4 according to some exemplary embodiments of the present disclosure.

FIG. 4 is a partial enlarged schematic view of part I in FIG. 3. FIG. 5 is a schematic cross-sectional view taken along line BB' in FIG. 4 according to some exemplary embodiments of the present disclosure. Referring to FIGS. 4 and 5 in combination, the display panel may include: an anode 41 disposed on the base substrate 1; a pixel defining layer 6 disposed on a side of the anode 41 away from the base substrate 1; a light-emitting layer 42 disposed on a side of the pixel defining layer 6 away from the base substrate 1; and a cathode 43 disposed on a side of the light-emitting layer 42 away from the base substrate 1.

It should be understood that the light-emitting layer 42 can be, for example, an organic light-emitting layer, and accordingly, the anode 41, the organic light-emitting layer 42 and the cathode 43 constitute the above-mentioned light-emitting device such as an OLED.

As shown in FIGS. 4 and 5, the pixel defining layer 6 may include a plurality of openings 62. The plurality of openings 62 are respectively located in the plurality of sub-pixels, for example, one opening 62 is provided in each sub-pixel. Each opening 62 exposes a part of the anode 41. A part of the light-emitting layer 42 is filled in the opening 62 so as to be in contact with the exposed part of the anode 41.

An actual light-emitting area of each sub-pixel is determined by an area of the part of the light-emitting layer 42 in contact with the anode 41, that is, by an area of each opening 62 of the pixel defining layer 6, more specifically, by an area of an orthographic projection of each opening 62 on the base substrate 1.

In addition, in order to avoid color mixing between two adjacent sub-pixels, openings 62 of any two adjacent sub-pixels (for example, sub-pixels SP1 and SP2) need to be separated by a prescribed distance, as indicated by the distance d in FIG. 4.

In this way, in each sub-pixel, the area of the opening 62 (that is, the actual light-emitting area) is smaller than an entire pixel area of the sub-pixel.

In this context, a ratio of the actual light-emitting area of each sub-pixel to the entire pixel area of the sub-pixel may represent an aperture ratio of the sub-pixel. As described above, the actual light-emitting area of the sub-pixel is determined by the area of the orthographic projection of each opening 62 on the base substrate 1. In addition, the entire pixel area of the sub-pixel can be determined in the following manner. For example, those skilled in the art should understand that each sub-pixel includes its own pixel circuit, and the pixel circuits are periodically arranged on the base substrate. Therefore, the entire pixel area of one sub-pixel can be determined by calculating an area of an orthographic projection of its pixel circuit on the base substrate. With reference to FIG. 4, the aperture ratio of the sub-pixel can be expressed by the following formula:

$$A.R. = \frac{S_R}{S_{pixel}} \times 100\%$$

Wherein A. R. represents the aperture ratio of the sub-pixel, SR represents the actual light-emitting area of the sub-pixel, and $S_{pixel}$ represents the entire pixel area of the sub-pixel.

Figure 6A:
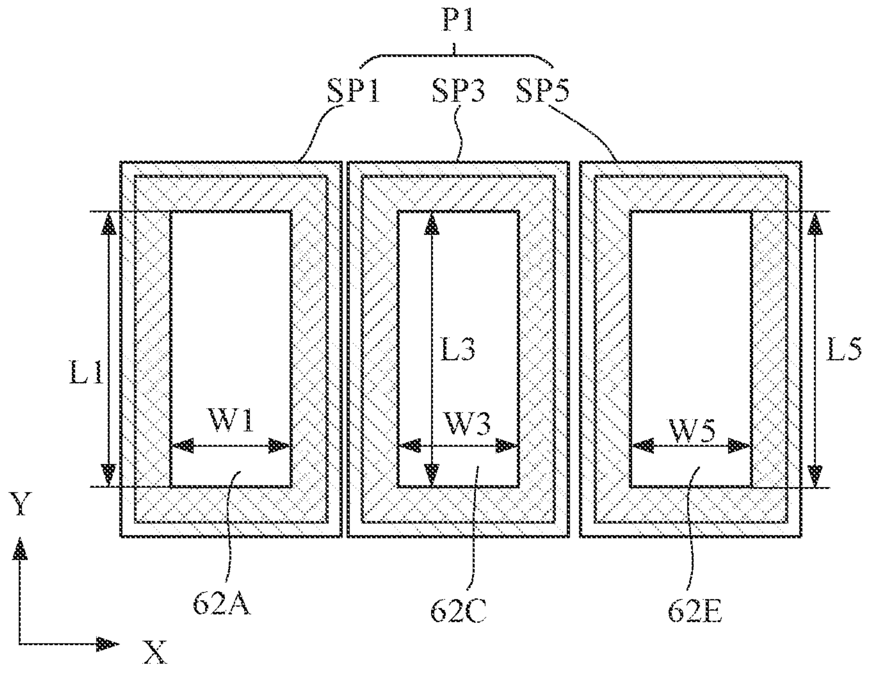
FIG. 6A is a schematic plan view of a first repeating unit in a first display area of a display panel according to some exemplary embodiments of the present disclosure.
Figure 6B:
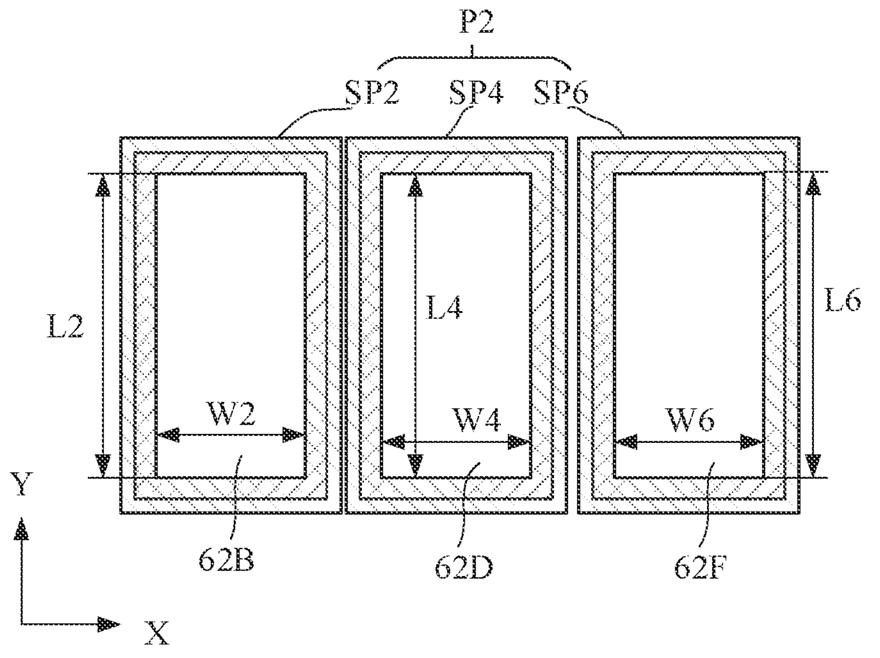
FIG. 6B is a schematic plan view of a second repeating unit in a second display area of a display panel according to some exemplary embodiments of the present disclosure.

FIG. 6A is a schematic plan view of a first repeating unit in a first display area of a display panel according to some exemplary embodiments of the present disclosure, and FIG. 6B is a schematic plan view of a second repeating unit in a second display area of a display panel according to some exemplary embodiments of the present disclosure.

For example, one first repeating unit P1 shown in FIG. 6A may include a first sub-pixel SP1 (for example, a red sub-pixel), a third sub-pixel SP3 (for example, a blue sub-pixel), and a fifth sub-pixel SP5 (for example, a green sub-pixel); one second repeating unit P2 shown in FIG. 6B may include a second sub-pixel SP2 (for example, a red sub-pixel), a fourth sub-pixel SP4 (for example, a blue sub-pixel), and a sixth sub-pixel SP6 (for example, a green sub-pixel). Colors of light emitted by the first sub-pixel SP1, the third sub-pixel SP3, and the fifth sub-pixel SP5 are the same as colors of light emitted by the second sub-pixel SP2, the fourth sub-pixel SP4, and the sixth sub-pixel SP6, respectively.

As described above, the sub-pixels located in the first display area AA1 and the second display area AA2 have the openings. For the convenience of description, the openings of the first sub-pixel SP1, the second sub-pixel SP2, the third sub-pixel SP3, the fourth sub-pixel SP4, the fifth sub-pixel SP5, and the sixth sub-pixel SP6 are referred to as a first opening 62A, a second opening 62B, a third opening 62C, a fourth opening 62D, a fifth opening 62E, and a sixth opening 62F, respectively.

Referring to FIGS. 6A and 6B, in the embodiment of the present disclosure, an area of an orthographic projection of the second opening 62B on the base substrate 1 is greater than an area of an orthographic projection of the first opening 62A on the base substrate 1.

In this way, in the embodiments of the present disclosure, since the area of the second opening 62B is greater than the area of the first opening 62A, the actual light-emitting area of the sub-pixel located in the second display area AA2 is greater than the actual light-emitting area of the sub-pixel having the same color located in the first display area AA1. Further, since light-emitting brightness of the sub-pixel is dependent on the actual light-emitting area of the sub-pixel, the light-emitting brightness of the sub-pixel located in the second display area AA2 is greater than the light-emitting brightness of the sub-pixel having the same color located in the first display area AA1. Considering that the pixel density of the first display area AA1 is greater than the pixel density of the second display area AA2, in the embodiments of the present disclosure, by designing the actual light-emitting area of the sub-pixel located in the second display area AA2 to be greater than the actual light-emitting area of the sub-pixel having the same color located in the first display area AA1, the uniformity of the light-emitting brightness of each repeating unit in the first display area AA1 and the light-emitting brightness of each repeating unit in the second display area AA2 is improved, thereby improving the display uniformity.

In addition, in the embodiments of the present disclosure, the actual light-emitting area is increased to increase the light-emitting brightness of the sub-pixels located in the second display area AA2. Therefore, there is no need to use other manners (such as increasing driving current) to increase the light-emitting brightness of the sub-pixels located in the second display area AA2, which is beneficial to increase the lifetime of the light-emitting material of the sub-pixels located in the second display area AA2. In this way, the uniformity of the lifetime of the light-emitting material of each sub-pixel located in the second display area AA2 and the lifetime of the light-emitting material of each sub-pixel located in the first display area AA1 is improved.

Continue to refer to FIGS. 6A and 6B, in the embodiments of the present disclosure, an area of an orthographic projection of the fourth opening 62D on the base substrate 1 is greater than an area of an orthographic projection of the third opening 62C on the base substrate 1. Alternatively or additionally, an area of an orthographic projection of the sixth opening 62F on the base substrate 1 is greater than an area of an orthographic projection of the fifth opening 62E on the base substrate 1. In this way, the display uniformity between the first display area and the second display area can be further improved, and the uniformity of the lifetime of the light-emitting material of each sub-pixel located in the second display area and the lifetime of the light-emitting material of each sub-pixel located in the first display area is improved.

For example, in the embodiments shown in FIGS. 6A and 6B, the orthographic projection of each of the first opening 62A, the second opening 62B, the third opening 62C, the fourth opening 62D, the fifth opening 62E, and the sixth opening 62F on the base substrate 1 has a rectangular shape.

The rectangle has a first size in the row direction X and a second size in the column direction Y. For example, the first opening 62A may have a first width W1 (i.e., a first size) in the row direction X and a first length L1 (i.e., a second size) in the column direction Y, and the second opening 62B may have a second width W2 (i.e., the first size) in the row direction X and the second length L2 (i.e., the second size) in the column direction Y.

The first size of the second opening 62B is greater than the first size of the first opening 62A, and the second size of the second opening 62B is greater than the second size of the first opening 62A. Exemplarily, the second width W2 can be greater than the first width W1, and/or the second length L2 can be greater than the first length L1.

In some exemplary embodiments, the second width W2 can be equal to (1+n)W1, and the second length L2 can be equal to (1+n)L1, where n is a number greater than zero. Thus, the area of the second opening 62B is $(1+n)^2$ times the area of the first opening 62A.

In this context, for the convenience of description, n can be referred to as an outwardly enlarged coefficient.

For example, n can be equal to about 9%, that is, the second width W2 is increased by about 9% relative to the first width W1, and the second length L2 is increased by about 9% relative to the first length L1. In this way, the area of the second opening 62B is approximately 1.19 times the area of the first opening 62A. The inventor found through research that when n is set to be less than or equal to 9%, the risk of color mixing caused by light emitted by two adjacent sub-pixels can be avoided. In other words, by setting n to be equal to about 9%, the display uniformity and the uniformity of the lifetime of the luminescent material between the first display area and the second display area can be improved as much as possible while avoiding color mixing. In addition, since the FMM (i.e. fine metal mask) used for an evaporation process has a certain tolerance design in the design, an opening of the FMM will be slightly greater than the opening of the corresponding sub-pixel. In the embodiments of the present disclosure, the opening defined by the pixel defining layer is slightly enlarged outwardly (for example, within 9%), and the outward enlargement is within the range of the tolerance design as described above. Therefore, in the embodiments of the present disclosure, there is no need to change the design of the FMM, which is beneficial to the production process, and saves manufacturing cost.

Optionally, the first size W4 of the fourth opening 62D is greater than the first size W3 of the third opening 62C, and the second size L4 of the fourth opening 62D is greater than the second size L3 of the third opening 62C.

Optionally, the first size W6 of the sixth opening 62F is greater than the first size W5 of the fifth opening 62E, and the second size L6 of the sixth opening 62F is greater than the second size L5 of the fifth opening 62E.

For example, in the exemplary embodiments shown in FIGS. 6A and 6B, for the first sub-pixel SP1 and the second sub-pixel having the first color, W2 can be equal to $(1+n_1)$ W1 and L2 can be equal to $(1+n_1)$ L1, wherein $n_1$ is a number greater than zero. Thus, the area of the second opening 62B is $(1+n_1)^2$ times the area of the first opening 62A. For the third sub-pixel SP3 and the fourth sub-pixel SP4 having the second color, W4 can be equal to $(1+n_2)$ W3, and L4 can be equal to $(1+n_2)$ L3, where $n_2$ is a number greater than 0. Thus, the area of the fourth opening 62D is $(1+n_1)^2$ times the area of the third opening 62C. For the fifth sub-pixel SP5 and the sixth sub-pixel SP6 having the third color, W6 can be equal to $(1+n_3)$ W5, and L6 can be equal to $(1+n_3)$ L5, where is $n_3$ a number greater than 0. Thus, the area of the sixth opening 62F is $(1+n_3)^2$ times the area of the fifth opening 62E.

For example, $n_1$, $n_2$ and $n_3$ can be equal to each other. That is, the outwardly enlarged coefficients of sub-pixels of different colors can be set to be the same as each other. For example, they may all be equal to about 9%. In this way, the openings of the sub-pixels of different colors are enlarged outwardly in an equal proportion, which is beneficial to the manufacturing process.

Optionally, $n_1$, $n_2$ and $n_3$ may not be equal to each other. That is, the outwardly enlarged coefficients of sub-pixels of different colors can be set to be different from each other. Optionally, two of $n_1$, $n_2$ and $n_3$ can be equal to each other. In this way, different outwardly enlarged coefficients can be designed for sub-pixels of different colors, which may increase design flexibility.

It should be understood that, $n_1$, $n_2$ and $n_3$ can be within the range of 9%, that is, they can be less than or equal to 9%.

Optionally, in some embodiments of the present disclosure, the aforementioned enlargement coefficients $n_1$, $n_2$ and $n_3$ can be greater than 0 and less than 30%, for example, can be 5%, 10%, 15%, 20%, etc.

Referring to FIGS. 4 and 5 in combination, for each sub-pixel of each repeating unit, the orthographic projection of the opening 62 on the base substrate 1 falls within the orthographic projection of the anode 41 on the base substrate 1, and there is a certain distance between an edge of the opening 62 and an edge of the anode 41, as shown by dl in FIG. 4. For example, for one sub-pixel of the first repeating unit P1, the distance dl can be equal to about 3.9 microns; for a sub-pixel of the second repeating unit P2, the distance dl can be equal to about 2.0 microns. In this way, the distance d between the openings 62 of two adjacent sub-pixels in the first repeating unit P1 is approximately 3.8 microns greater than the distance d between the openings 62 of two adjacent sub-pixels in the second repeating unit P2. Optionally, in an embodiment of the present disclosure, the distance d between the openings 62 of two adjacent sub-pixels in the second repeating unit P2 is greater than 4 microns, for example, between 4 and 20 microns. When the distance d between the openings 62 of two adjacent sub-pixels in the second repeating unit P2 is less than 4 microns, the risk of color mixing between two adjacent sub-pixels is relatively high. Correspondingly, the distance d between the openings 62 of two adjacent sub-pixels in the first repeating unit P1 is at least 3 microns greater than the distance d between the openings 62 of two adjacent sub-pixels in the second repeating unit P2.

Figure 7:
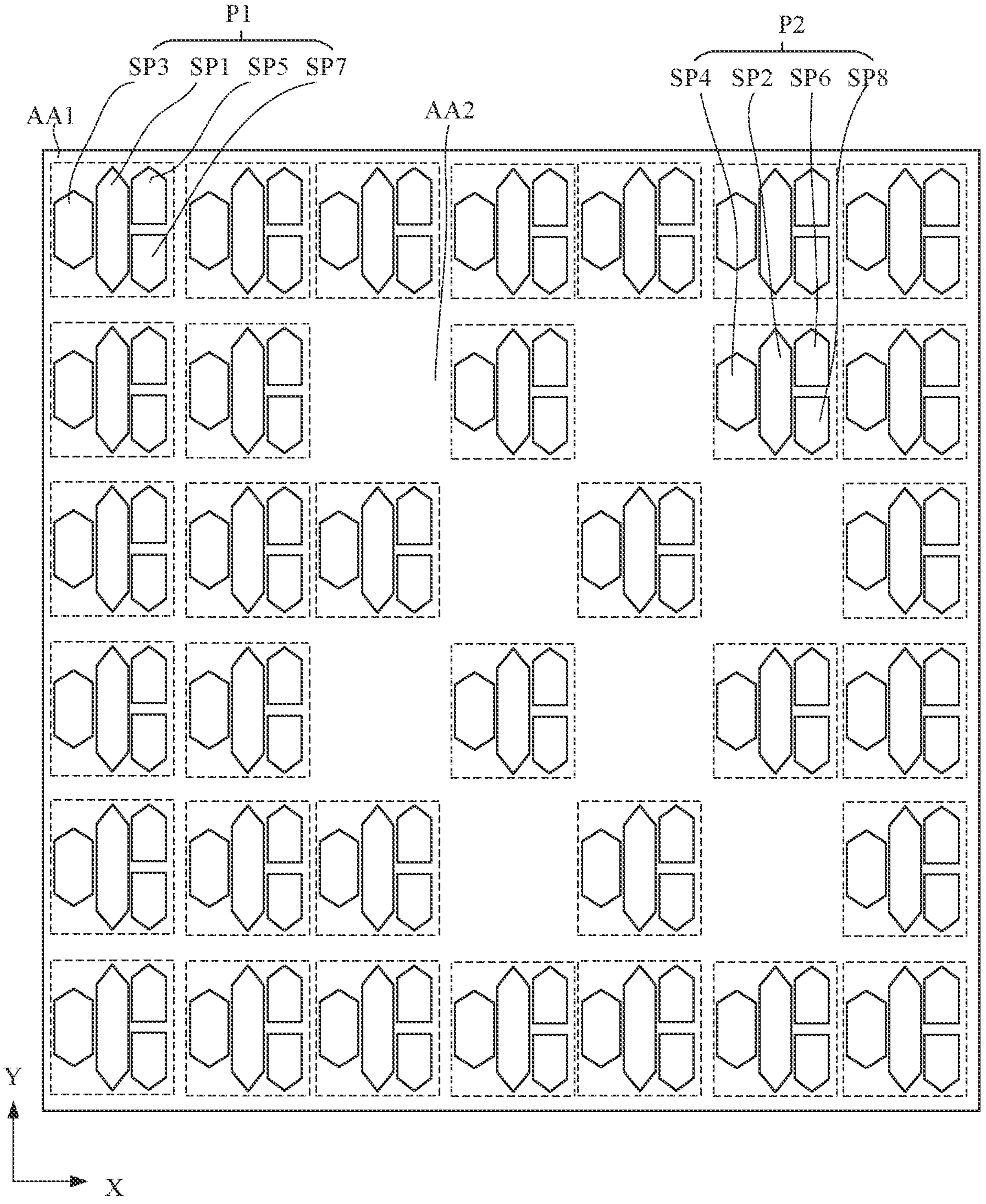
FIG. 7 is a schematic plan view of a display panel according to some exemplary embodiments of the present disclosure.

FIG. 7 is a schematic plan view of a display panel according to some exemplary embodiments of the present disclosure. Referring to FIG. 7, the display panel includes a plurality of repeating units arranged in an array in a row direction X and a column direction Y. Some repeating units P1 (i.e., first repeating units) are located in the first display area AA1, and some repeating units P2 (i.e., second repeating units) are located in the second display area AA2. The pixel density of the first display area AA1 is greater than the pixel density of the second display area AA2.

Each repeating unit may include 4 sub-pixels. Specifically, the first repeating unit P1 may include a first sub-pixel SP1, a third sub-pixel SP3, a fifth sub-pixel SP5, and a seventh sub-pixel SP7, and the second repeating unit P2 may include a second sub-pixel SP2, a fourth sub-pixel SP4, a sixth sub-pixel SP6, and the eighth sub-pixel SP8. Adjacent fifth sub-pixel SP5 and seventh sub-pixel SP7 may form a sub-pixel group, and adjacent sixth sub-pixel SP6 and eighth sub-pixel SP8 may also form a sub-pixel group.

For example, the fifth sub-pixel SP5, the seventh sub-pixel SP7, the sixth sub-pixel SP6 and the eighth sub-pixel SP8 can be sub-pixels of colors which are sensitive to human eyes, such as green sub-pixels, yellow sub-pixels, white sub-pixels, or the like. For example, compared to the first sub-pixel SP1 to the fourth sub-pixels SP4, the area of each of the fifth sub-pixel SP5, the seventh sub-pixel SP7, the sixth sub-pixel SP6 and the eighth sub-pixel SP8 is relatively small.

The first sub-pixel SP1, the second sub-pixel SP2, the third sub-pixel SP3, and the fourth sub-pixel SP4 can be sub-pixels of colors which are not sensitive to human eyes. For example, the first sub-pixel SP1 and the second sub-pixel SP2 are red sub-pixels, and the third sub-pixel SP3 and the fourth sub-pixel SP4 are blue sub-pixels, but the embodiments of the present disclosure are not limited thereto. In some exemplary embodiments of the present disclosure, by taking an example, the first sub-pixel SP1 and the second sub-pixel SP2 are red sub-pixels, and the third sub-pixel SP3 and the fourth sub-pixel SP4 are blue sub-pixels. It should be noted that when the pixel arrangement structure adopts the red-green-blue (RGB) mode, the above-mentioned color which is sensitive to human eyes can be green.

In the embodiments according to the present disclosure, by arranging various sub-pixels in this way, the visual resolution of the pixel arrangement structure can be improved, thereby improving the display quality. In addition, the fifth sub-pixel and the sixth sub-pixel, the seventh sub-pixel and the eighth sub-pixel are of the same color, so that the luminescent material layers of the two sub-pixels in the same one sub-pixel group can be formed by evaporation from the same opening of a mask. Therefore, the process difficulty of preparing the luminescent material layers in these sub-pixels can be reduced.

Similarly, referring to FIG. 5 in combination, the display panel may include: an anode 41 disposed on the base substrate 1; a pixel defining layer 6 disposed on a side of the anode 41 away from the base substrate 1; a light-emitting layer 42 disposed on a side of the pixel defining layer 6 away from the base substrate 1; and a cathode 43 disposed on a side of the light-emitting layer 42 away from the base substrate 1.

The pixel defining layer 6 includes a plurality of openings 62. The plurality of openings 62 are respectively located in the plurality of sub-pixels, for example, one opening 62 is provided in each sub-pixel. Each opening 62 exposes a part of the anode 41. A part of the light-emitting layer 42 is filled in the opening 62 so as to be in contact with the exposed part of the anode 41.

Figure 8A:
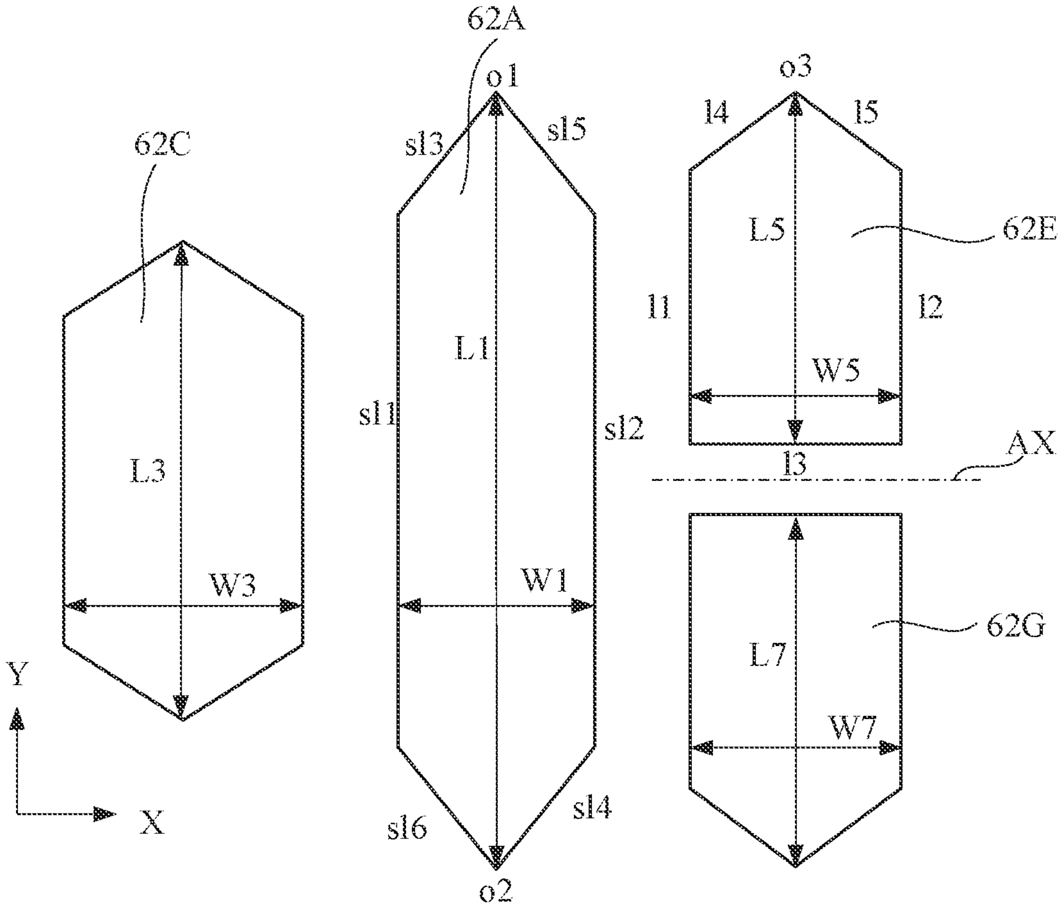
FIG. 8A is a schematic plan view of a first repeating unit in a first display area of a display panel according to some exemplary embodiments of the present disclosure.
Figure 8B:
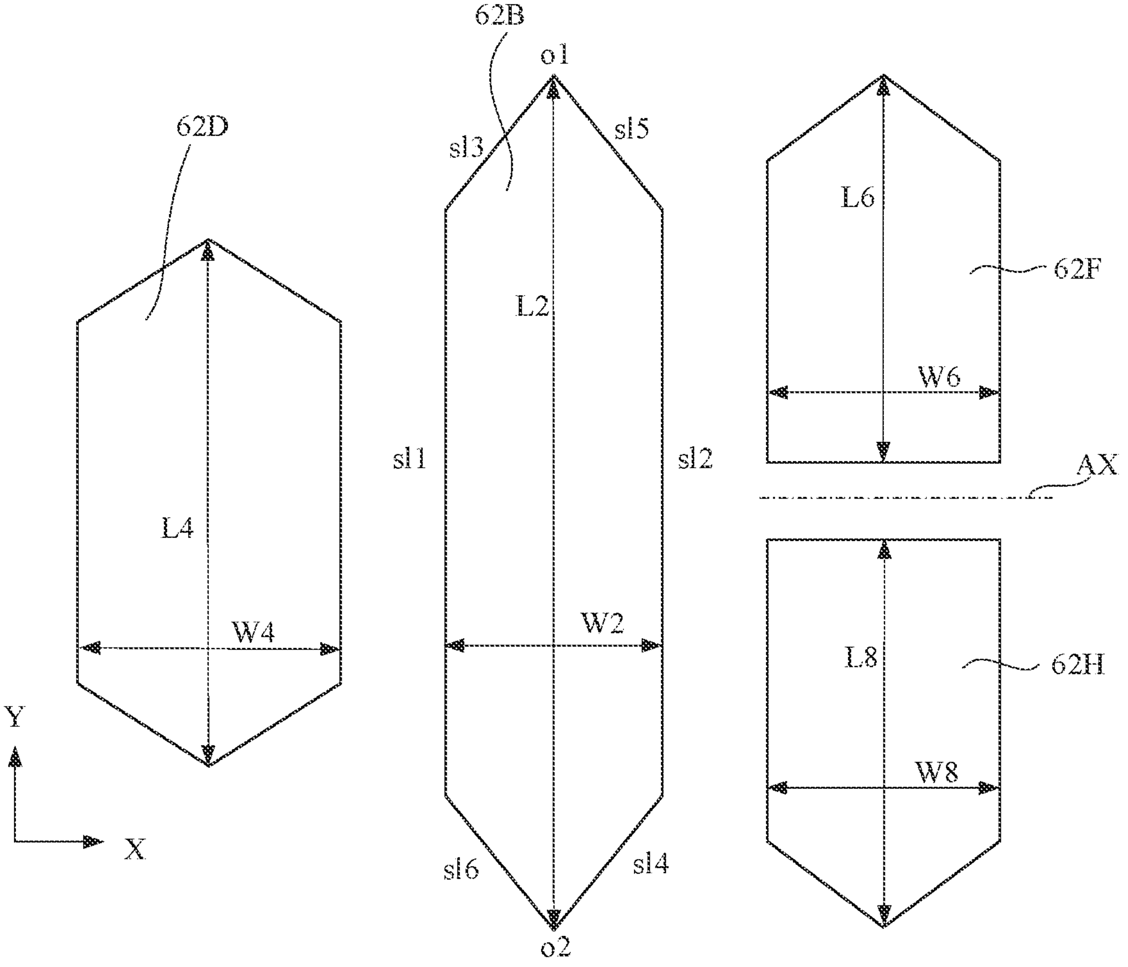
FIG. 8B is a schematic plan view of a second repeating unit in a second display area of the display panel according to some exemplary embodiments of the present disclosure.

FIG. 8A is a schematic plan view of a first repeating unit located in a first display area of a display panel according to some exemplary embodiments of the present disclosure, and FIG. 8B is a schematic plan view of a second repeating unit located in the second display area of a display panel according to some exemplary embodiments of the present disclosure. In order to clearly show the shape and size of the opening, only the opening of each sub-pixel is shown in FIGS. 8A and 8B, and other structures are omitted.

As described above, the sub-pixels located in the first display area AA1 and the second display area AA2 have openings. For the convenience of description, the openings of the first sub-pixel SP1, the second sub-pixel SP2, the third sub-pixel SP3, and the fourth sub-pixel SP4, the fifth sub-pixel SP5, the sixth sub-pixel SP6, the seventh sub-pixel SP7, and the eighth sub-pixel SP8 are referred to as a first opening 62A, a second opening 62B, a third opening 62C, a fourth opening 62D, a fifth opening 62E, a sixth opening 62F, a seventh opening 62G, and an eighth opening 62H, respectively.

Referring to 8A and 8B, in the embodiments of the present disclosure, the area of the orthographic projection of the second opening 62B on the base substrate 1 is greater than the area of the orthographic projection of the first opening 62A on the base substrate 1.

In this way, in the embodiments of the present disclosure, since the area of the second opening 62B is greater than the area of the first opening 62A, the actual light-emitting area of the sub-pixel located in the second display area AA2 is greater than the actual light-emitting area of the sub-pixel with the same color located in the first display area AA1. Further, as the light-emitting brightness of the sub-pixel is dependent on the actual light-emitting area of the sub-pixel, the light-emitting brightness of the sub-pixel located in the second display area AA2 is greater than the light-emitting brightness of the sub-pixel with the same color located in the first display area AA1. Considering that the pixel density of the first display area AA1 is greater than the pixel density of the second display area AA2, in the embodiments of the present disclosure, the actual light-emitting area of the sub-pixel located in the second display area AA2 is greater than the actual light-emitting area of the sub-pixel with the same color located in the first display area AA, so as to improve the uniformity between the light-emitting brightness of each repeating unit in the first display area AA1 and the light-emitting brightness of each repeating unit in the second display area AA2, thereby improving the display uniformity.

In addition, in the embodiments of the present disclosure, the actual light-emitting area is increased to increase the light-emitting brightness of the sub-pixel located in the second display area AA2. Therefore, there is no need to use other manners (such as increasing the driving current) to increase the light-emitting brightness of the sub-pixel located in the second display area AA2, therefore, it is beneficial to increase the lifetime of the light-emitting material of the sub-pixel located in the second display area AA2. In this way, the uniformity between the lifetime of the light-emitting material of each sub-pixel located in the second display area AA2 and the lifetime of the light-emitting material of each sub-pixel located in the first display area AA1 is improved.

Continue to refer to FIGS. 8A and 8B, in the embodiments of the present disclosure, the area of the orthographic projection of the fourth opening 62D on the base substrate 1 is greater than the area of the orthographic projection of the third opening 62C on the base substrate 1.

A sum of areas of orthographic projections of the sixth opening 62F and the eighth opening 62H on the base substrate 1 is greater than a sum of areas of orthographic projections of the fifth opening 62E and the seventh opening 62G on the base substrate 1. In this way, the display uniformity between the first display area and the second display area can be further improved, and the uniformity between the lifetime of the light-emitting material of each sub-pixel located in the first display area and the lifetime of the light-emitting material of each sub-pixel located in the second display area can be improved.

Continue to refer to FIGS. 8A and 8B, the orthographic projection of each of the first opening 62A, the second opening 62B, the third opening 62C, and the fourth opening 62D on the base substrate 1 has a hexagonal shape.

Specifically, each hexagon includes three groups of opposite sides, the opposite sideshow being spaced apart from each other and arranged in parallel. That is, each hexagon includes six sides, which are respectively sl1, sl2, sl3, sl4, sl5, and sl6 in the drawings, wherein the side sl1 and the side sl2 are spaced apart and parallel to each other, the side sl3 and the side sl4 are spaced apart and parallel to each other, and the side sl5 and the side sl6 are spaced apart and parallel to each other. The side sl1 and the side sl2 extend in the column direction Y, the side sl3 and the side sl5 intersect at a vertex o1, and the side sl4 and the side sl6 intersect at a vertex o2.

In FIG. 8A, a vertical distance between the side sl1 and the side sl2 (can be called the first width) is W1, and a distance between the vertex o1 and the vertex o2 (can be called the first length) is L1. Then, the area of the orthographic projection of the first opening 62A on the base substrate 1 can be calculated by the following formula:

$$S_{62A} = W1 * (L1 - \frac{\sqrt{3}}{6} W1).$$

In FIG. 8B, a vertical distance between the side sl1 and the side sl2 (can be called the second width) is W2, and a distance between the vertex o1 and the vertex o2 (can be called the second length) is L2. Then, the area of the orthographic projection of the second opening 62B on the base substrate 1 can be calculated by the following formula:

$$S_{62B} = W2 * (L2 - \frac{\sqrt{3}}{6} W2).$$

It should be noted that the W1 and W2 can be regarded as the first size in the row direction X, and the L1 and L2 can be regarded as the second size in the column direction Y.

Exemplarily, the second width W2 can be greater than the first width W1, and/or, the second length L2 can be greater than the first length L1.

In some exemplary embodiments, the second width W2 can be equal to (1+n)W1, and the second length L2 can be equal to (1+n)L1, wherein n is a number greater than zero. Thus, the area of the second opening 62B is $(1+n)^2$ times the area of the first opening 62A.

Likewise, n can be equal to about 9%, that is, the second width W2 is increased by about 9% relative to the first width W1, and the second length L2 is increased by about 9% relative to the first length L1. In this way, the area of the second opening 62B is approximately 1.19 times the area of the first opening 62A.

Optionally, the first size W4 of the fourth opening 62D is greater than the first size W3 of the third opening 62C, and the second size L4 of the fourth opening 62D is greater than the second size L3 of the third opening 62C.

For example, in the embodiments shown in FIGS. 8A and 8B, for the first sub-pixel SP1 and the second sub-pixel having the first color, W2 can be equal to $(1+n_1)$ W1, and L2 can be equal to $(1+n_1)$ L1, wherein $n_1$ is a number greater than zero. Thus, the area of the second opening 62B is $(1+n_1)^2$ times the area of the first opening 62A. For the third sub-pixel SP3 and the fourth sub-pixel SP4 having the second color, W4 can be equal to $(1+n_2)$ W3, and L4 can be equal to $(1+n_2)$ L3, wherein $n_2$ is a number greater than zero. Thus, the area of the second opening 62B is $(1+n_2)^2$ times the area of the first opening 62A.

For example, $n_1$ and $n_2$ can be equal to each other. That is, enlargement coefficients of sub-pixels of different colors can be set to be equal to each other. For example, they may all be less than or equal to about 9%.

Optionally, $n_1$ and $n_2$ may not be equal to each other. That is, the enlargement coefficients of sub-pixels of different colors can be set to be different from each other.

Continue to refer to FIGS. 8A and 8B, the orthographic projection of each of the fifth sub-pixel SP5, the sixth sub-pixel SP6, the seventh sub-pixel SP7, and the eighth sub-pixel SP8 on the base substrate 1 may have a pentagonal shape. Each pentagon may include five sides, that is, l1, l2, l3, l4, and l5 in the drawings, wherein the side l1 and the side l2 are spaced apart and parallel to each other, one end of the side l3 intersects the side l1, and the other end of the side l3 intersects the side l2, the side l4 and the side l5 intersect at a vertex o3, and the vertex o3 is opposite to the side l3.

For example, in each repeating unit, there is a symmetry axis AX extending in the row direction X, the fifth sub-pixel SP5 and the seventh sub-pixel SP7 are symmetrical about the symmetry axis AX, and the sixth sub-pixel SP6 and the eighth sub-pixel SP8 is symmetrical about the symmetry axis AX. It should be understood that the symmetry axis AX is an imaginary axis and is not an actual structure of the display panel.

In FIG. 8A, vertical distances between the side l1 and the side l2 (which can be referred to as the first size in the row direction X) are respectively W5 and W7, and vertical distances between the vertex o3 and the side l3 (which can be referred to as the second size in the column direction Y) are respectively L5 and L7. In FIG. 8B, vertical distances between the side l1 and the side l2 (which can be referred to as the first size in the row direction X) are respectively W6 and W8, and vertical distances between the vertex o3 and the side l3 (which can be referred to as the second size in the column direction Y) are respectively L6 and L8.

Similarly, in some exemplary embodiments, W6 can be equal to $(1+n_3)$W5, L6 can be equal to $(1+n_3)$L5, W8 can be equal to $(1+n_3)$W7, and L8 can be equal to $(1+n_3)$L7, where $n_3$ is a number greater than zero. In this way, a sum of areas of the sixth opening 62F of the sixth sub-pixel SP6 and the eighth opening 62H of the eighth sub-pixel SP8 shown in FIG. 8B is $(1+n_2)^2$ times a sum of areas of the fifth opening 62E of the fifth sub-pixel SP5 and the seventh opening 62G of the seventh sub-pixel SP7 shown in FIG. 8A.

Similarly, for example, n, can be equal to about 9%, that is, W6 is increased by about 9% relative to W5, and L6 is increased by about 9% relative to L5. In this way, the sum of the areas of the sixth opening 62F of the sixth sub-pixel SP6 and the eighth opening 62H of the eighth sub-pixel SP8 shown in FIG. 8B is about 1.19 times the sum of the areas of the fifth opening 62E of the fifth sub-pixel SP5 and the seventh opening 62G of the seventh sub-pixel SP7 shown in FIG. 8A. In this way, the display uniformity and the uniformity of the lifetime of the luminescent material between the first display area and the second display area can be improved as much as possible while avoiding color mixing.

Optionally, $n_1$, $n_2$ and $n_3$ can be equal to each other. That is, the enlargement coefficients of sub-pixels of different colors can be set to be equal to each other. For example, they may all be equal to about 9%.

Optionally, $n_1$, $n_2$ and $n_3$ may not be equal to each other. That is, the enlargement coefficients of sub-pixels of different colors can be set to be different from each other. Optionally, two of $n_1$, $n_2$ and $n_3$ can be equal to each other.

Similarly, in some embodiments of the present disclosure, the aforementioned enlargement coefficients $n_1$, $n_2$ and $n_3$ can be greater than 0 and less than 30%, for example, can be 5%, 10%, 15%, 20%, etc.

In the embodiments of the present disclosure, the distance d between the openings 62 of two adjacent sub-pixels in the second repeating unit P2 is greater than 4 microns, that is, in one of the second repeating units, the minimum distance between edges of the openings of the two adjacent sub-pixels is more than 4 microns, for example, in a range from 4 to 20 microns. When the distance d between the openings 62 of the two adjacent sub-pixels in the second repeating unit P2 is less than 4 microns, the risk of color mixing between the two adjacent sub-pixels is relatively high. Correspondingly, the distance d between the openings 62 of two adjacent sub-pixels in the first repeating unit P1 is at least 3 microns greater than the distance d between the openings 62 of two adjacent sub-pixels in the second repeating unit P2.

Figure 9:
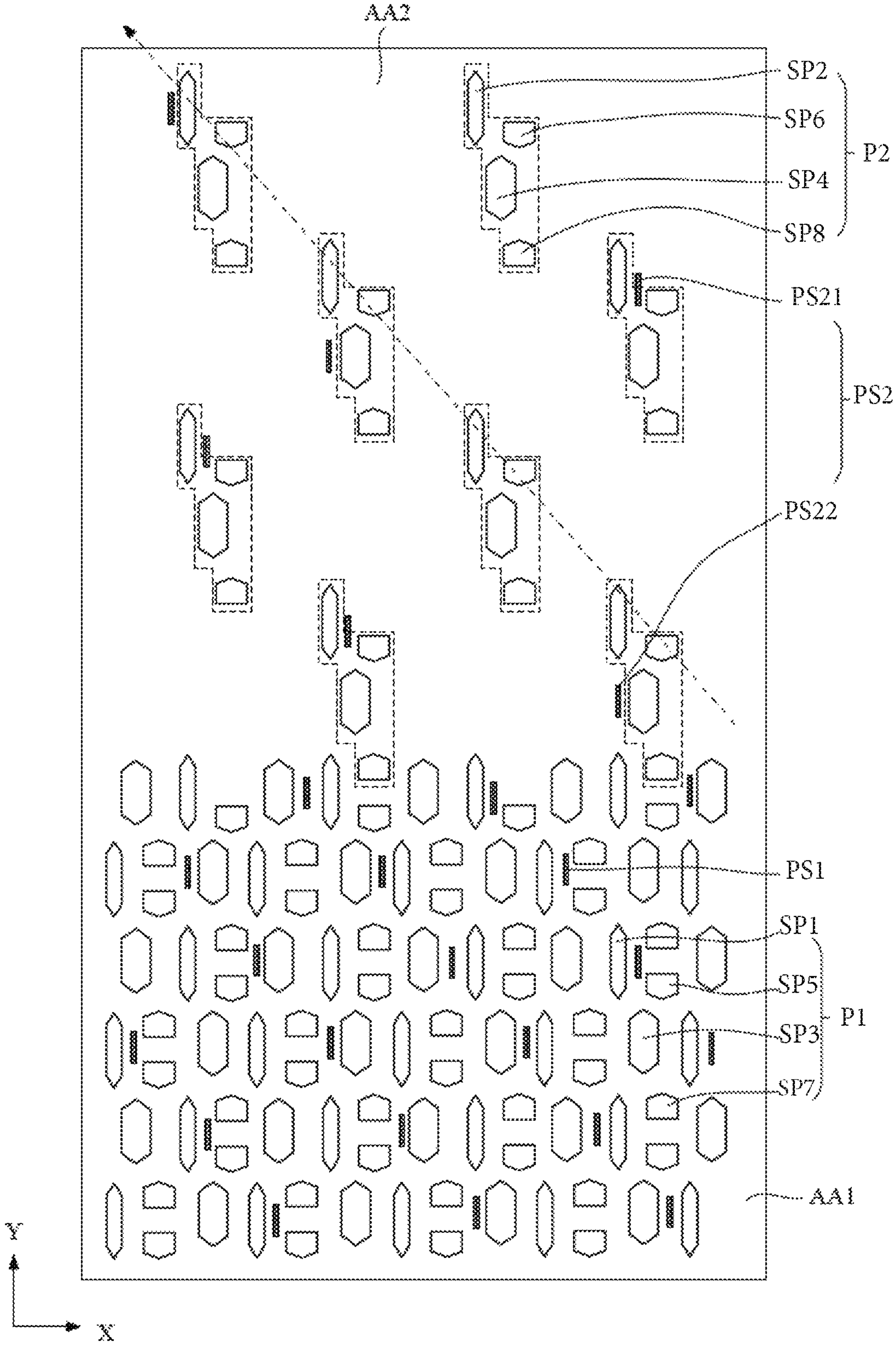
FIG. 9 is a schematic plan view of a display panel according to some exemplary embodiments of the present disclosure.
Figure 10A:
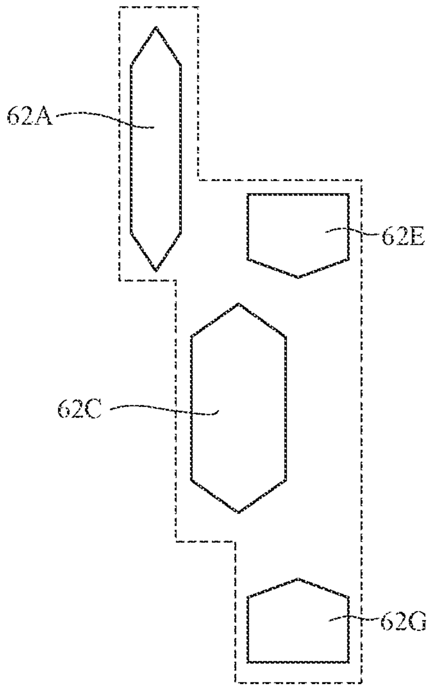
FIG. 10A is a schematic plan view of a first repeating unit in a first display area of a display panel according to some exemplary embodiments of the present disclosure.
Figure 10B:
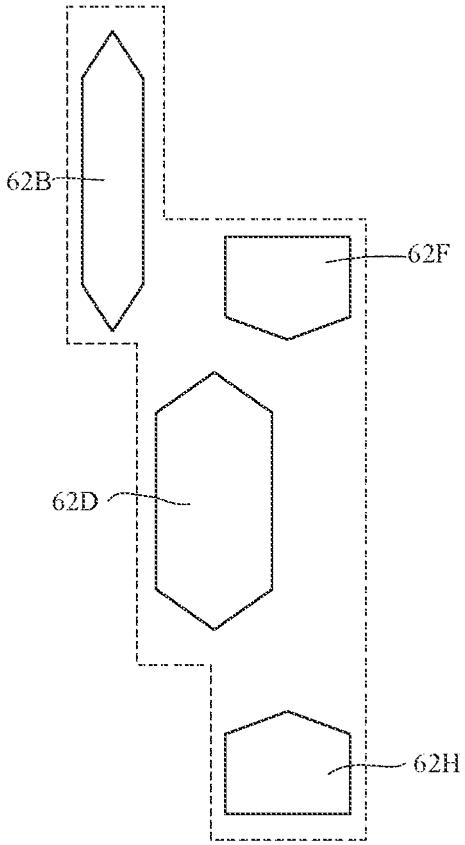
FIG. 10B is a schematic plan view of a second repeating unit in a second display area of a display panel according to some exemplary embodiments of the present disclosure.

FIG. 9 is a schematic plan view of a display panel according to some exemplary embodiments of the present disclosure. FIG. 10A is a schematic plan view of a first repeating unit located in a first display area of a display panel according to some exemplary embodiments of the present disclosure, and FIG. 10B is a schematic plan view of a second repeating unit located in the second display area of the display panel according to some exemplary embodiments of the present disclosure. In order to clearly show the shape and size of the opening, only the opening of each sub-pixel is shown in FIGS. 10A and 10B, and other structures are omitted.

The special features of the present embodiments will be described below in conjunction with FIG. 9, FIG. 10A and FIG. 10B. It should be understood that other structures and features of the present embodiments can be referred to the above description.

Referring to FIG. 9, the display panel includes a plurality of repeating units arranged in an array in the row direction X and in the column direction Y. Some repeating units P1 (i.e., the first repeating units) are located in the first display area AA1, and some repeating units P2 (i.e., the second repeating units) are located in the second display area AA2.

Each repeating unit may include four sub-pixels. Specifically, the first repeating unit P1 may include a first sub-pixel SP1, a third sub-pixel SP3, a fifth sub-pixel SP5, and a seventh sub-pixel SP7, and the second repeating unit P2 may include a second sub-pixel SP2, a fourth sub-pixel SP4, a sixth sub-pixel SP6, and an eighth sub-pixel SP8.

For example, the fifth sub-pixel SP5, the seventh sub-pixel SP7, the sixth sub-pixel SP6 and the eighth sub-pixel SP8 can be sub-pixels of colors which are sensitive to human eyes, such as green sub-pixels, yellow sub-pixels, white sub-pixels, or the like. For example, compared to the first to fourth sub-pixels SP1 to SP4, an area of each of the fifth sub-pixel SP5, the seventh sub-pixel SP7, the sixth sub-pixel SP6 and the eighth sub-pixel SP8 is relatively small.

The first sub-pixel SP1, the second sub-pixel SP2, the third sub-pixel SP3, and the fourth sub-pixel SP4 can be sub-pixels of colors which are not sensitive to human eyes. For example, the first sub-pixel SP1 and the second sub-pixel SP2 are red sub-pixels, and the third sub-pixel SP3 and the fourth sub-pixel SP4 are blue sub-pixels, but the embodiments of the present disclosure are not limited thereto. In some exemplary embodiments of the present disclosure, by taking an example, the first sub-pixel SP1 and the second sub-pixel SP2 are red sub-pixels, and the third sub-pixel SP3 and the fourth sub-pixel SP4 are blue sub-pixels. It should be noted that when the pixel arrangement structure adopts the red-green-blue (RGB) mode, the above-mentioned color which is sensitive to human eyes can be green.

In the embodiments according to the present disclosure, by arranging various sub-pixels in this way, the visual resolution of the pixel arrangement structure can be improved, thereby improving the display quality.

As described above, the sub-pixels located in the first display area AA1 and the second display area AA2 have openings. For the convenience of description, the openings of the first sub-pixel SP1, the second sub-pixel SP2, the third sub-pixel SP3, the fourth sub-pixel SP4, the fifth sub-pixel SP5, the sixth sub-pixel SP6, the seventh sub-pixel SP7, and the eighth sub-pixel SP8 are referred to as a first opening 62A, a second opening 62B, a third opening 62C, and a fourth opening 62D, a fifth opening 62E, a sixth opening 62F, a seventh opening 62G, and an eighth opening 62H, respectively.

Referring to FIG. 9, a plurality of first repeating units P1 are arranged in an array in a row direction X and a column direction Y, and a plurality of second repeating units P2 are arranged in an array in a row direction X and a column direction Y. The distribution density of the first repeating units P1 is greater than the distribution density of the second repeating units P2.

For one second repeating unit P2, the sixth sub-pixel SP6 and the eighth sub-pixel SP8 are located in the same column, and are arranged on both sides of the fourth sub-pixel SP4 in the column direction Y. The second sub-pixel SP2, the fourth sub-pixel SP4, and the sixth/eighth sub-pixel SP6/SP8 are respectively located in three columns, that is, the second sub-pixel SP2, the fourth sub-pixel SP4, and the sixth/eighth sub-pixel SP6/SP8 are arranged in sequence in the row direction X. The second sub-pixel SP2 and the sixth sub-pixel SP6 are located in the same row. The second/sixth sub-pixel SP2/SP6, the fourth sub-pixel SP4, and the eighth sub-pixel SP8 are arranged in sequence in the column direction Y.

The second repeating unit P2 is aligned with some of the first repeating units P1 in the column direction Y. For example, the second repeating units P2 are only aligned with the first repeating units P1 in odd columns in the column direction Y, and the second repeating units P2 are not provided in columns where the first repeating units P1 in even columns are located. Of course, in other embodiments, the second repeating units P2 are only aligned with the first repeating units P1 in even columns in the column direction Y, and the second repeating units P2 are not provided in columns where the first repeating units P1 in odd columns are located. Specifically, in two adjacent rows of second repeating units P2, a second repeating unit P2 located in one row and a second repeating unit P2 located in the other row and adjacent to the second repeating unit P2 are spaced apart in the row direction X, by a spacing distance that is substantially equal to the size (i.e., width) of one first repeating unit in the row direction X.

Continue to refer to FIG. 9, in the second repeating units P2 in the same row, two adjacent second repeating units P2 are spaced apart from each other in the row direction X, by a spacing distance that is substantially equal to the size of three first repeating units in the row direction X.

The plurality of first repeating units P1 are arranged in an array in the row direction X and in the column direction Y, and the plurality of second repeating units P2 are arranged in an array in the row direction X and in the column direction Y. Correspondingly, the sub-pixels included in each repeating unit P1 and P2 are also arranged in an array in the row direction X and in the column direction Y. In the repeating units P1 and P2 in the same column, the first sub-pixels SP1 and the second sub-pixels SP2 are located in the same column, the third sub-pixels SP3 and the fourth sub-pixels SP4 are located in the same column, and the fifth sub-pixels SP5, the seventh sub-pixels SP7, the sixth sub-pixels SP6 and the eighth sub-pixels SP8 are located in the same column.

For example, in the first display area AA1, the first sub-pixels SP1 included in the first repeating units P1 are arranged in an array in the row direction X and in the column direction Y. In the first repeating units P1 in the same row, two adjacent first sub-pixels SP1 are separated by two columns of sub-pixels, that is, separated by one column of third sub-pixels SP3 and one column of fifth/seventh sub-pixels SP5/SP7.

For example, in the second display area AA2, the second sub-pixels SP2 included in the second repeating units P2 are arranged in an array in the row direction X and in the column direction Y. In the second repeating units P2 in the same row, two adjacent second sub-pixels SP2 are separated by eleven columns of sub-pixels, that is, separated by one column of fourth sub-pixels SP4, one column of sixth/eighth sub-pixels SP6/SP8, a column of first sub-pixels SP1, one column of third sub-pixels SP3, one column of fifth/seventh sub-pixels SP5/SP7, one column of first sub-pixels SP1, one column of third sub-pixels SP3, one column of fifth/seventh sub-pixels SP5/SP7, one column of first sub-pixels SP1, one column of third sub-pixels SP3, and one column of fifth/seventh sub-pixels SP5/SP7 in sequence.

Continue to refer to FIG. 9, the display panel further includes a plurality of spacers. For the convenience of description, the spacer located in the first display area AA1 is described as a first spacer PS1, and the spacer located in the second display area AA2 is described as a second spacer PS2.

The plurality of first spacers PS1 are arranged in an array in the row direction X and in the column direction Y in the first display area AA1, and the plurality of second spacers PS2 are arranged in an array in the row direction X and in the column direction Y in the second display area AA2. A distribution density of the first spacers PS1 is greater than a distribution density of the second spacers PS2. For example, the distribution density of the second spacers PS2 can be about ⅙ to ⅓ of the distribution density of the first spacers PS1. For example, as shown in FIG. 9, the distribution density of the second spacers PS2 can be about ¼ of the distribution density of the first spacers PS1.

The second spacers PS2 are only arranged in an area where the second repeating unit P2 is located, that is, no second spacers PS2 are arranged in the light-transmitting area TRA where the second repeating units P2 are not disposed.

For example, the number of second spacers PS2 is not greater than the number of second repeating units P2.

Optionally, the number of second spacers PS2 can be equal to the number of second repeating units P2, for example, only one second spacer PS2 is provided in each second repeating unit P2. Optionally, as shown in FIG. 9, the number of second spacers PS2 can be less than the number of second repeating units P2, for example, only one second spacer PS2 is provided in each of some second repeating units P2, and no second spacer PS2 is provided in each of some other second repeating units P2.

Continue to refer to FIG. 9, in the second display area AA2, some second spacers PS2 are disposed between the second sub-pixel SP2 and the sixth sub-pixel SP6. For the convenience of description, the second spacer PS2 provided between the second sub-pixel SP2 and the sixth sub-pixel SP6 is referred to as the first sub-spacer PS21. For a plurality of first sub-spacers PS21 located in the same column, a connecting line of these first sub-spacers PS21 passes through the fourth sub-pixels SP4, that is, they are aligned with the fourth sub-pixels SP4 in the column direction Y.

In the second display area AA2, some other second spacers PS2 are disposed on a side of the fourth sub-pixel SP4 and aligned with the second sub-pixel SP2 in the column direction Y. For the convenience of description, the second spacer PS2 provided on the side of the fourth sub-pixel SP4 is referred to as the second sub-spacer PS22. For a plurality of second sub-spacers PS22 located in the same column, a connecting line of these second sub-spacers PS22 passes through the second sub-pixel SP2.

If the XY coordinate system in FIG. 9 is rotated counterclockwise by 45°, that is, the column direction Y extends in an upper left direction that is at 45° relative to the horizontal line, and the row direction X extends in an upper right direction that is at 45° relative to the horizontal line. In this case, the second spacers located in the same column are of the same type, that is, the spacers in the same column are all the first sub-spacers PS21 or the second sub-spacers PS22. In two adjacent columns of spacers, the types of the second spacers are different, that is, in the two adjacent columns of spacers, one column of spacers are the first sub-spacers PS21, and the other column of spacers are the second sub-spacers PS22. That is to say, in an oblique column direction (as indicated by the direction Y1 in FIG. 9) that is at a certain oblique angle (for example,) 45° with respect to the column direction Y, the second spacers in the same oblique column are all the first sub-spacers PS21 or the second sub-spacers PS22. In two adjacent oblique columns of second spacers, one column of second spacers are the first sub-spacers PS21 and the other column of second spacers are the second sub-spacers PS22.

Referring to FIGS. 10A and 10B, in the embodiments of the present disclosure, the area of the orthographic projection of the second opening 62B on the base substrate 1 is greater than the area of the orthographic projection of the first opening 62A on the base substrate 1.

The area of the orthographic projection of the fourth opening 62D on the base substrate 1 is greater than the area of the orthographic projection of the third opening 62C on the base substrate 1.

The sum of the areas of the orthographic projections of the sixth opening 62F and the eighth opening 62H on the base substrate 1 is greater than the sum of the areas of the orthographic projections of the fifth opening 62E and the seventh opening 62G on the base substrate 1. For example, the area of the orthographic projection of the sixth opening 62F on the base substrate 1 is greater than the area of the orthographic projection of the fifth opening 62E on the base substrate 1, and the area of the orthographic projection of the eighth opening 62H on the base substrate 1 is greater than the area of the orthographic projection of the seventh opening 62G on the base substrate 1.

In other words, the opening of each sub-pixel in the second repeating unit P2 is enlarged outwardly with respect to the opening of each corresponding sub-pixel in the first repeating unit P1. For the detailed description of outward enlargement, please refer to the above description in conjunction with FIG. 1 to FIG. 8B, which is not repeated here.

In this way, the display uniformity between the first display area and the second display area can be further improved, and the uniformity between the lifetime of the light-emitting material of each sub-pixel located in the first display area and the second display area can be improved.

Figure 11:
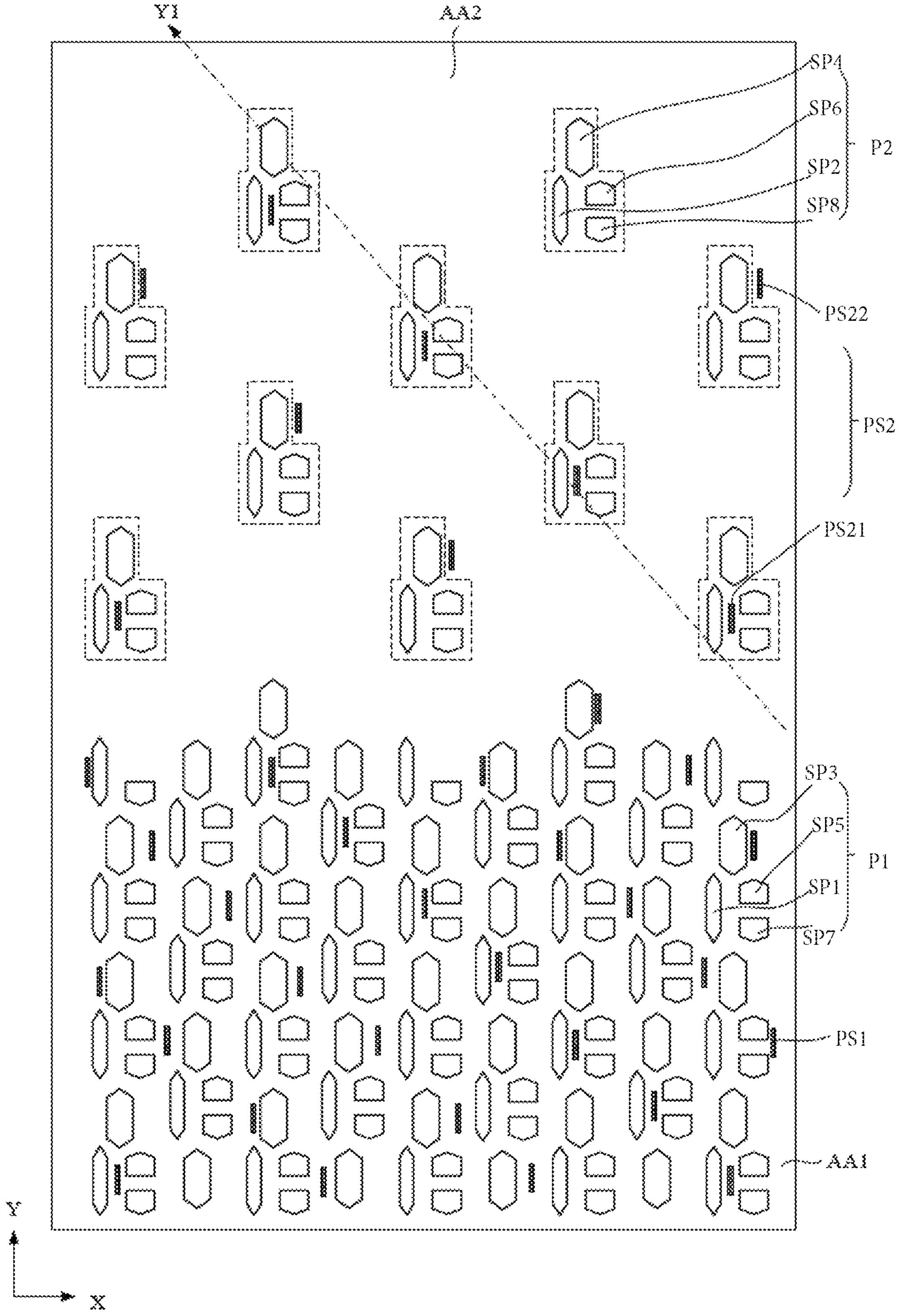
FIG. 11 is a schematic plan view of a display panel according to some exemplary embodiments of the present disclosure.
Figure 12A:
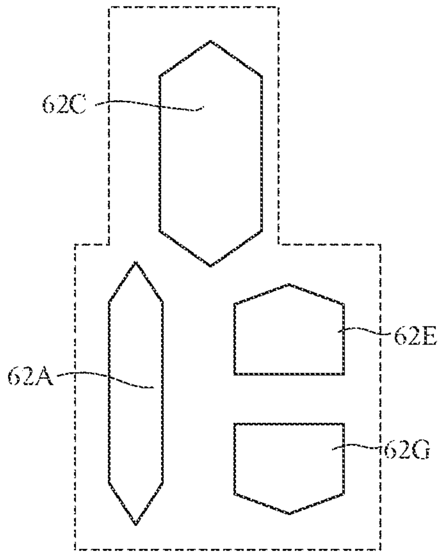
FIG. 12A is a schematic plan view of a first repeating unit in a first display area of a display panel according to some exemplary embodiments of the present disclosure.
Figure 12B:
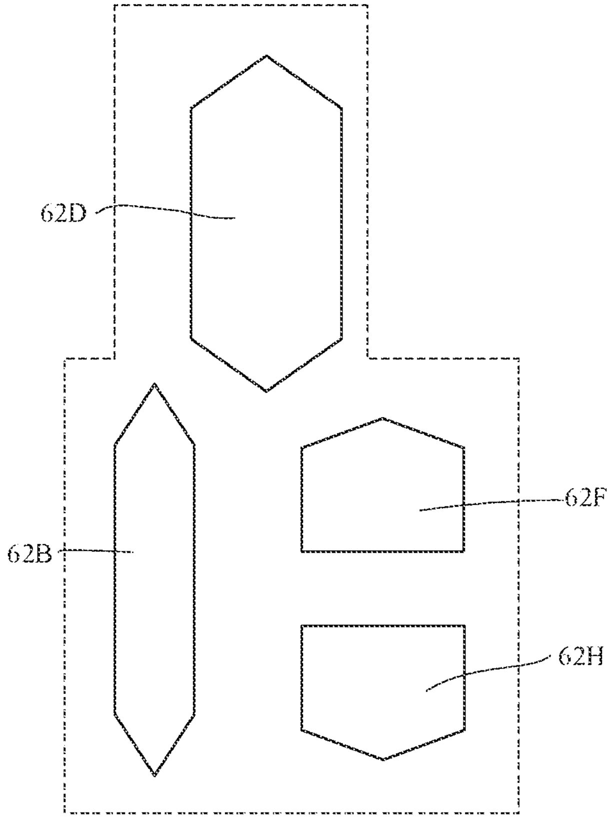
FIG. 12B is a schematic plan view of a second repeating unit in a second display area of a display panel according to some exemplary embodiments of the present disclosure.

FIG. 11 is a schematic plan view of a display panel according to some exemplary embodiments of the present disclosure. FIG. 12A is a schematic plan view of a first repeating unit located in a first display area of a display panel according to some exemplary embodiments of the present disclosure, and FIG. 12B is a schematic plan view of a second repeating unit located in the second display area of a display panel according to some exemplary embodiments of the present disclosure. In order to clearly show the shape and size of the opening, only the opening of each sub-pixel is shown in FIGS. 12A and 12B, and other structures are omitted.

The special features of the embodiments will be described below in conjunction with FIG. 11, FIG. 12A, and FIG. 12B. It should be understood that other structures and features of the embodiments may refer to the above description.

Referring to FIG. 11, the display panel includes a plurality of repeating units arranged in an array in a row direction X and a column direction Y. Some repeating units P1 (i.e., the first repeating units) are located in the first display area AA1, and some other repeating units P2 (i.e., the second repeating units) are located in the second display area AA2.

In the illustrated embodiment, each repeating unit can include four sub-pixels. Specifically, the first repeating unit P1 may include a first sub-pixel SP1, a third sub-pixel SP3, a fifth sub-pixel SP5, and a seventh sub-pixel SP7, and the second repeating unit P2 may include a second sub-pixel SP2, a fourth sub-pixel SP4, a sixth sub-pixel SP6, and an eighth sub-pixel SP8.

Referring to FIG. 11, a plurality of first repeating units P1 are arranged in an array in the row direction X and in the column direction Y, and a plurality of second repeating units P2 are arranged in an array in the row direction X and in the column direction Y. The distribution density of the first repeating units P1 is greater than the distribution density of the second repeating units P2.

For one second repeating unit P2, the sixth sub-pixel SP6 and the eighth sub-pixel SP8 are located in the same column, and are arranged on the same side of the fourth sub-pixel SP4 in the column direction Y. The sixth sub-pixel SP6 and the eighth sub-pixel SP8 are spaced apart in the column direction Y. The sixth sub-pixel SP6 and the eighth sub-pixel SP8 are arranged on the same side of the second sub-pixel SP2 in the row direction X. The second sub-pixel SP2, the fourth sub-pixel SP4, and the sixth/eighth sub-pixel SP6/SP8 are respectively located in three columns, that is, the second sub-pixel SP2, the fourth sub-pixel SP4, and the sixth/eighth sub-pixel SP6/SP8 are arranged in sequence in the row direction X. The combination of the sixth sub-pixel SP6 and the eighth sub-pixel SP8 is located in the same row as the second sub-pixel SP2. The fourth sub-pixel SP4 and the second/sixth/eighth sub-pixels SP2/SP6/SP8 are sequentially arranged in the column direction Y.

The second repeating units P2 are aligned with some first repeating units P1 in the column direction Y. For example, the second repeating units P2 are only aligned with the first repeating units P1 in odd columns in the column direction Y, and no second repeating units P2 are provided in columns where the first repeating units P1 in even columns are located. Of course, in other embodiments, the second repeating units P2 are only aligned with the first repeating units P1 in the even columns in the column direction Y, and no second repeating units P2 are provided in the columns where the first repeating units P1 in the odd columns are located. Specifically, in two adjacent rows of second repeating units P2, a second repeating unit P2 located in one row and a second repeating unit P2 which is located in the other row and adjacent to the second repeating unit P2 are separated by one repeating unit in the row direction X.

Continue to refer to FIG. 11, in the second repeating units P2 in the same row, two adjacent second repeating units P2 are separated by three repeating units in the row direction X.

The plurality of first repeating units P1 are arranged in an array in the row direction X and in the column direction Y, and the plurality of second repeating units P2 are arranged in an array in the row direction X and in the column direction Y. Correspondingly, the sub-pixels included in each repeating unit P1 and P2 are also arranged in an array in the row direction X and in the column direction Y. In the repeating units P1 and P2 in the same column, the first sub-pixel SP1 and the second sub-pixel SP2 are located in the same column, the third sub-pixel SP3 and the fourth sub-pixel SP4 are located in the same column, and the fifth sub-pixel SP5, the seventh sub-pixel SP7, the sixth sub-pixel SP6 and the eighth sub-pixel SP8 are located in the same column.

For example, in the first display area AA1, the first sub-pixels SP1 included in the first repeating unit P1 are arranged in an array in the row direction X and in the column direction Y. In the first repeating units P1 in the same row, two adjacent first sub-pixels SP1 are separated by two columns of sub-pixels, that is, separated by one column of third sub-pixels SP3 and one column of fifth/seventh sub-pixels SP5/SP7.

For example, in the second display area AA2, the second sub-pixels SP2 included in the second repeating unit P2 are arranged in an array in the row direction X and in the column direction Y. In the second repeating units P2 in the same row, two adjacent second sub-pixels SP2 are separated by eleven columns of sub-pixels, that is, separated by one column of fourth sub-pixels SP4, one column of sixth/eighth sub-pixels SP6/SP8, a column of first sub-pixels SP1, a column of third sub-pixels SP3, a column of fifth/seventh sub-pixels SP5/SP7, a column of first sub-pixels SP1, a column of third sub-pixels SP3, a column of fifth/seventh sub-pixels SP5/SP7, a column of first sub-pixels SP1, a column of third sub-pixels SP3, and a column of fifth/seventh sub-pixels SP5/SP7.

Continue to refer to FIG. 11, the display panel further includes a plurality of spacers. For the convenience of description, the spacer located in the first display area AA1 is described as a first spacer PS1, and the spacer located in the second display area AA2 is described as a second spacer PS2.

The plurality of first spacers PS1 are arranged in an array in the row direction X and in the column direction Y in the first display area AA1, and the plurality of second spacers PS2 are arranged in an array in the row direction X and in the column direction Y in the second display area AA2. A distribution density of the first spacers PS1 is greater than a distribution density of the second spacers PS2. For example, the distribution density of the second spacers PS2 can be about ⅙ to ⅓ of the distribution density of the first spacers PS1. For example, as shown in FIG. 11, the distribution density of the second spacers PS2 can be about ⅓ of the distribution density of the first spacers PS1.

The second spacers PS2 are only arranged in an area where the second repeating unit P2 is located, that is, no second spacers PS2 are arranged in the light-transmitting area TRA where the second repeating units P2 are not disposed.

For example, the number of second spacers PS2 is not greater than the number of second repeating units P2.

Optionally, the number of second spacers PS2 can be equal to the number of second repeating units P2, for example, only one second spacer PS2 is provided in each second repeating unit P2. Optionally, as shown in FIG. 11, the number of second spacers PS2 can be less than the number of second repeating units P2, for example, only one second spacer PS2 is provided in each of some second repeating units P2, and no second spacer PS2 is provided in each of some other second repeating units P2.

Continue to refer to FIG. 11, in the second display area AA2, some second spacers PS2 are disposed between the second sub-pixel SP2 and a combination of the sixth sub-pixel SP6 and the eighth sub-pixel SP8. For the convenience of description, these second spacers PS2 are referred to as the first sub-spacers PS21. For a plurality of first sub-spacers PS21 located in the same column, a connecting line of these first sub-spacers PS21 passes through the fourth sub-pixels SP4, that is, they are aligned with the fourth sub-pixels SP4 in the column direction Y.

In the second display area AA2, some other second spacers PS2 are disposed on a side of the fourth sub-pixel SP4 and aligned with the combination of the sixth sub-pixel SP6 and the eighth sub-pixel SP8. For the convenience of description, these second spacers PS2 are referred to as the second sub-spacers PS22. For a plurality of second sub-spacers PS22 located in the same column, a connecting line of these second sub-spacers PS22 passes through the sixth sub-pixels SP6 and the eighth sub-pixels SP8.

Similarly, if the XY coordinate system in FIG. 11 is rotated counterclockwise by 45°, that is, the column direction Y extends in an upper left direction that is at 45° relative to the horizontal line, and the row direction X extends in an upper right direction that is at 45° relative to the horizontal line. In this case, the second spacers located in the same column are of the same type, that is, the spacers in the same column are all the first sub-spacers PS21 or the second sub-spacers PS22. In two adjacent columns of spacers, the types of the second spacers are different, that is, in the two adjacent columns of spacers, one column of spacers are the first sub-spacers PS21, and the other column of spacers are the second sub-spacers PS22. That is to say, in an oblique column direction (as indicated by the direction Y1 in FIG. 11) that is at a certain oblique angle (for example, 45°) with respect to the column direction Y, the second spacers in the same oblique column are all the first sub-spacers PS21 or the second sub-spacers PS22. In two adjacent oblique columns of second spacers, one column of second spacers are the first sub-spacers PS21 and the other column of second spacers are the second sub-spacers PS22.

Referring to FIGS. 12A and 12B, in the embodiments of the present disclosure, the area of the orthographic projection of the second opening 62B on the base substrate 1 is greater than the area of the orthographic projection of the first opening 62A on the base substrate 1.

The area of the orthographic projection of the fourth opening 62D on the base substrate 1 is greater than the area of the orthographic projection of the third opening 62C on the base substrate 1.

The sum of the areas of the orthographic projections of the sixth opening 62F and the eighth opening 62H on the base substrate 1 is greater than the sum of the areas of the orthographic projections of the fifth opening 62E and the seventh opening 62G on the base substrate 1. For example, the area of the orthographic projection of the sixth opening 62F on the base substrate 1 is greater than the area of the orthographic projection of the fifth opening 62E on the base substrate 1, and the area of the orthographic projection of the eighth opening 62H on the base substrate 1 is greater than the area of the orthographic projection of the seventh opening 62G on the base substrate 1.

In other words, the opening of each sub-pixel in the second repeating unit P2 is enlarged outwardly with respect to the opening of each corresponding sub-pixel in the first repeating unit P1. For the detailed description of outward enlargement, please refer to the preceding description in conjunction with FIG. 1 to FIG. 8B, which is not repeated here.

In this way, the display uniformity between the first display area and the second display area can be further improved, and the uniformity between the lifetime of the light-emitting material of each sub-pixel located in the first display area and the second display area can be improved.

Figure 13:
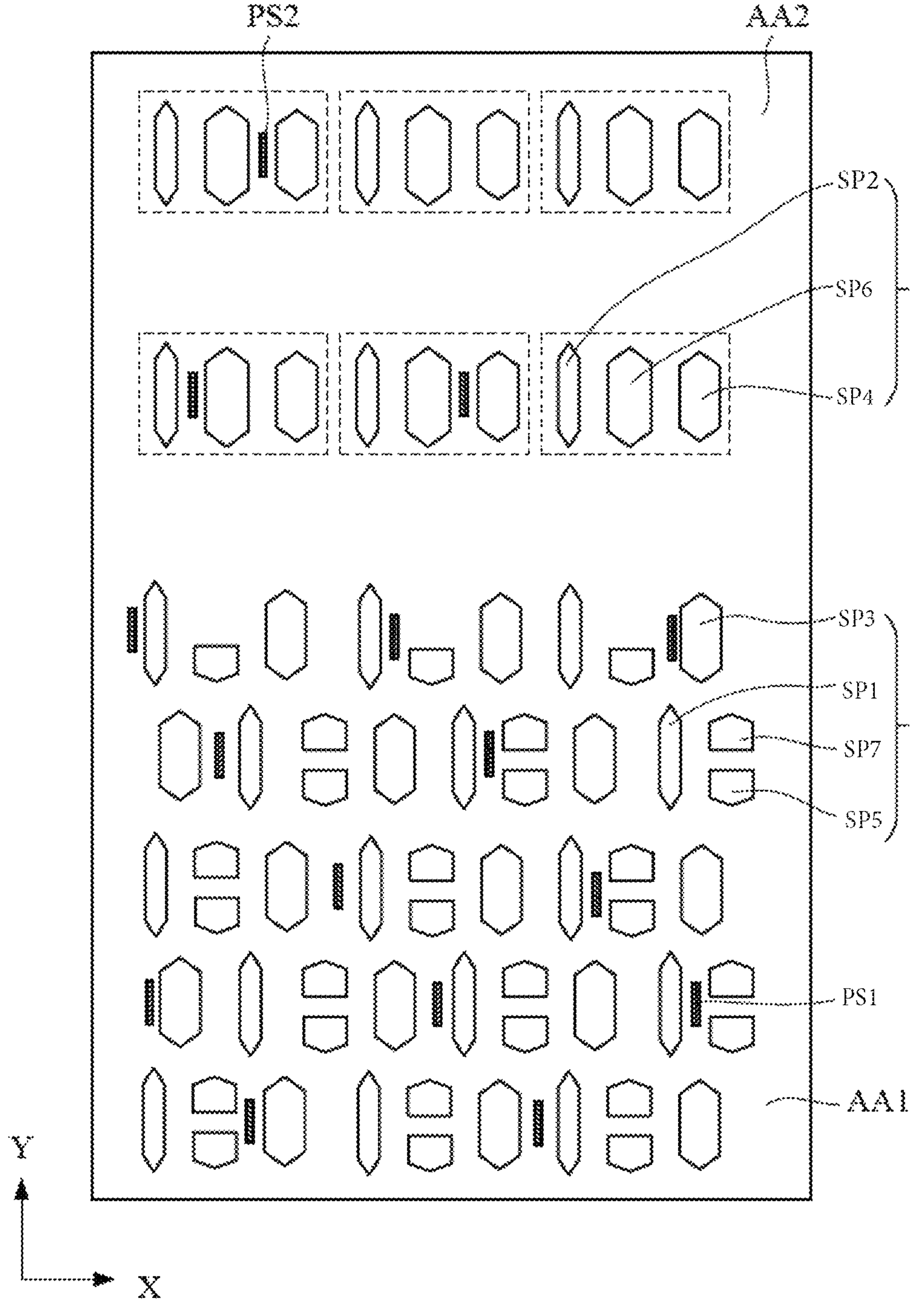
FIG. 13 is a schematic plan view of a display panel according to some exemplary embodiments of the present disclosure.
Figure 14A:
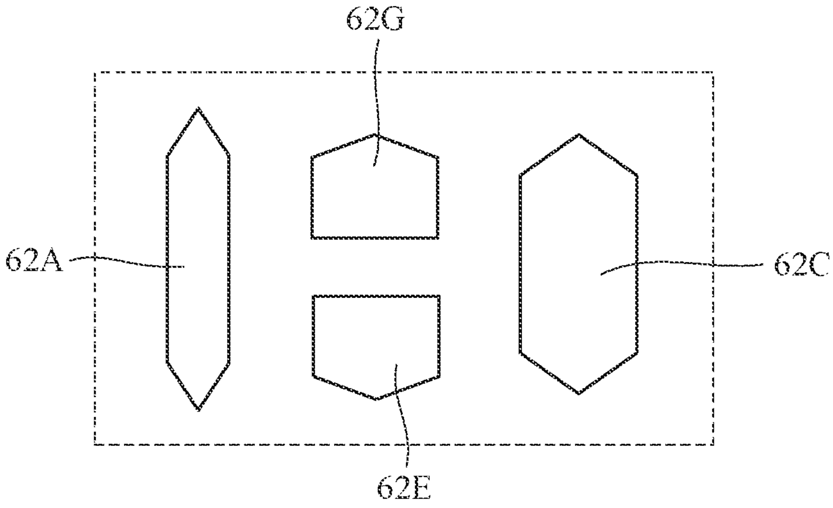
FIG. 14A is a schematic plan view of a first repeating unit in a first display area of a display panel according to some exemplary embodiments of the present disclosure.
Figure 14B:
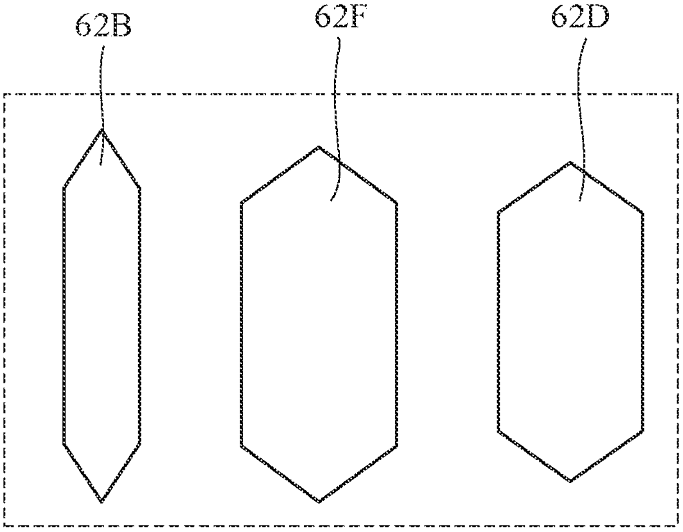
FIG. 14B is a schematic plan view of a second repeating unit in a second display area of the display panel according to some exemplary embodiments of the present disclosure.

FIG. 13 is a schematic plan view of a display panel according to some exemplary embodiments of the present disclosure. FIG. 14A is a schematic plan view of a first repeating unit located in a first display area of a display panel according to some exemplary embodiments of the present disclosure, and FIG. 14B is a schematic plan view of a second repeating unit located in a second display area of a display panel according to some exemplary embodiments of the present disclosure. In order to clearly show the shape and size of the opening, only the opening of each sub-pixel is shown in FIGS. 14A and 14B, and other structures are omitted.

The special features of the embodiments will be described below in conjunction with FIG. 13, FIG. 14A, and FIG. 14B. It should be understood that other structures and features of the embodiments can be referred to the above description.

Referring to FIG. 13, the display panel includes a plurality of repeating units arranged in an array in the row direction X and in the column direction Y. Some repeating units P1 (i.e., the first repeating units) are located in the first display area AA1, and some repeating units P2 (i.e., the second repeating units) are located in the second display area AA2.

Some first repeating units P1 may each include four sub-pixels, namely, a first sub-pixel SP1, a third sub-pixel SP3, a fifth sub-pixel SP5, and a seventh sub-pixel SP7. The second repeating unit P2 may include three sub-pixels, namely, a second sub-pixel SP2, a fourth sub-pixel SP4, and a sixth sub-pixel SP6.

Optionally, for a plurality of first repeating units P1 arranged near an edge of the second display area AA2, for example, referring to FIG. 13, for a row of first repeating units P1 near a lower edge of the second display area AA2, each first repeating unit P1 may include three sub-pixels, namely, a first sub-pixel SP1, a third sub-pixel SP3, and a fifth sub-pixel SP5. That is, in the row of first repeating units P1, each first repeating unit P1 does not include the seventh sub-pixel SP7. The fifth sub-pixel SP5 is farther away from a row of second repeating units P2 adjacent to the row of first repeating units P1 than the first sub-pixel SP1 or the third sub-pixel SP3, that is, a distance between the fifth sub-pixel SP5 and the adjacent row of second repeating units P2 in the column direction Y is greater than a distance between the first sub-pixel SP1 or the third sub-pixel SP3 and the adjacent row of second repeating units P2 in the column direction Y. In this way, in the row of first repeating units P1 near the lower edge of the second display area AA2, a concave structure is formed at each fifth sub-pixel SP5. In this way, the distance between the fifth sub-pixel SP5 and the adjacent row of second repeating units P2 can be increased, so that the area of the light-transmitting area TRA can be increased, thus the transmittance can be increased.

Referring to FIG. 13, the plurality of first repeating units P1 are arranged in an array in the row direction X and in the column direction Y, and the plurality of second repeating units P2 are arranged in an array in the row direction X and in the column direction Y. The distribution density of the first repeating units P1 is greater than the distribution density of the second repeating units P2.

For one second repeating unit P2, the second sub-pixel SP2, the sixth sub-pixel SP6, and the fourth sub-pixel SP4 are located in the same row, and are arranged in the that order in the row direction X.

There is a blank row between two adjacent rows of second repeating units P2, that is, no second repeating unit P2 is provided in the blank row. In other words, a spacing distance between two adjacent rows of second repeating units P2 is equal to the size of one second repeating unit P2 in the column direction Y. In this way, the area of the light-transmitting area TRA can be increased.

Continue to refer to FIG. 13, the display panel further includes a plurality of spacers. For the convenience of description, the spacer located in the first display area AA1 is described as a first spacer PS1, and the spacer located in the second display area AA2 is described as a second spacer PS2.

A plurality of first spacers PS1 are arranged in an array in the row direction X and in the column direction Y in the first display area AA1, and a plurality of second spacers PS2 are arranged in an array in the row direction X and in the column direction Y in the second display area AA2. The distribution density of the first spacers PS1 is greater than the distribution density of the second spacers PS2. For example, the distribution density of the second spacers PS2 can be about $\frac{1}{4}$ to $\frac{1}{2}$ of the distribution density of the first spacers PS1. For example, as shown in FIG. 13, the distribution density of the second spacers PS2 can be about $\frac{1}{2}$ of the distribution density of the first spacers PS1.

The second spacers PS2 are only arranged in the area where the second repeating units P2 are located, that is, no second spacer PS2 is arranged in the light-transmitting area TRA where no second repeating units P2 are provided.

For example, the number of second spacers PS2 is not greater than the number of second repeating units P2.

Optionally, the number of second spacers PS2 can be equal to the number of second repeating units P2, for example, only one second spacer PS2 is provided in each second repeating unit P2. Optionally, as shown in FIG. 13, the number of second spacers PS2 can be less than the number of second repeating units P2. For example, only one second spacer PS2 is provided in each of some second repeating units P2, and no second spacer PS2 is provided in each of the other second repeating units P2.

Referring to FIGS. 14A and 14B, in the embodiments of the present disclosure, the area of the orthographic projection of the second opening 62B on the base substrate 1 is greater than the area of the orthographic projection of the first opening 62A on the base substrate 1.

The area of the orthographic projection of the fourth opening 62D on the base substrate 1 is greater than the area of the orthographic projection of the third opening 62C on the base substrate 1.

In other words, the opening of each sub-pixel in the second repeating unit P2 is enlarged outwardly with respect to the opening of each corresponding sub-pixel in the first repeating unit P1. For the detailed description of outward enlargement, please refer to the above description in conjunction with FIG. 1 to FIG. 8B, which is not repeated here.

Referring to FIGS. 13, 14A and 14B in combination, one first repeating unit P1 includes two green sub-pixels, namely, the fifth sub-pixel SP5 and the seventh sub-pixel SP7. The opening 62E of the fifth sub-pixel SP5 and the opening 62G of the seventh sub-pixel SP7 are not communicated with each other, and they are separated by a portion of the pixel defining layer. One second repeating unit P2 includes one green sub-pixel, namely, the sixth sub-pixel SP6. The opening 62F of the sixth sub-pixel SP6 can be enlarged outwardly based on that the opening 62E and the opening 62G are communicated with each other.

As shown in FIG. 14A, the opening 62E of the fifth sub-pixel SP5 and the opening 62G of the seventh sub-pixel SP7 are shown, and a portion 65 of the pixel defining layer 6 between the opening 62E and the opening 62G is also shown. The area of the opening 62F of the sixth sub-pixel SP6 on the base substrate 1 is greater than an area of a combination of the opening 62E of the fifth sub-pixel SP5, the opening 62G of the seventh sub-pixel SP7 and the portion 65 on the base substrate 1. That is, the opening 62F of the sixth sub-pixel SP6 in the second repeating unit P2 is enlarged outwardly relative to the combination of the opening 62E of the fifth sub-pixel SP5, the opening 62G of the seventh sub-pixel SP7, and the portion 65 in the first repeating unit P1. For the detailed description of outward enlargement, please refer to the above description in conjunction with FIG. 1 to FIG. 8B, which is not repeated here.

In this way, the display uniformity between the first display area and the second display area can be further improved, and the uniformity between the lifetime of the light-emitting material of each sub-pixel located in the first display area and the second display area can be improved.

Figure 15:
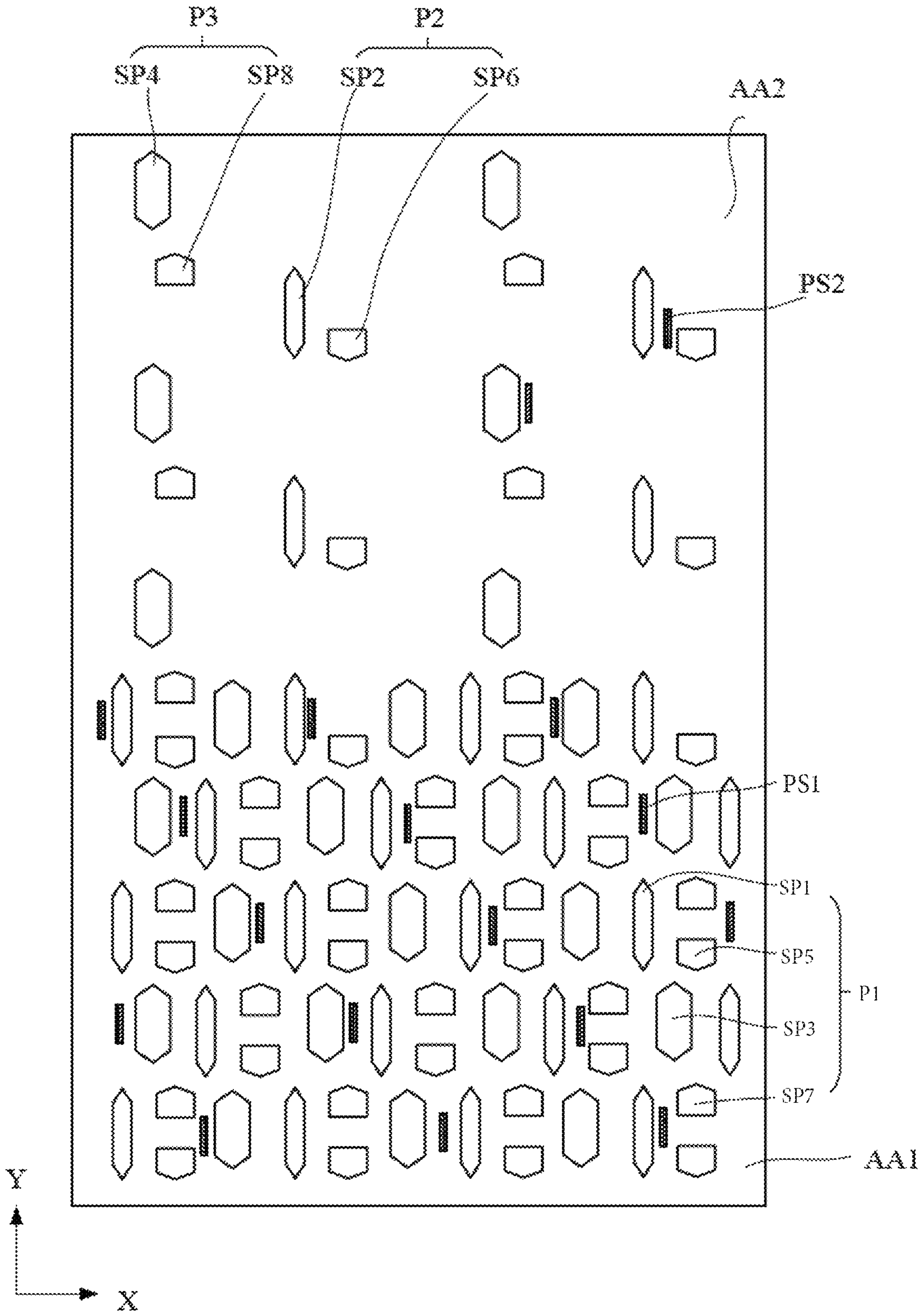
FIG. 15 is a schematic plan view of a display panel according to some exemplary embodiments of the present disclosure.
Figure 16A:
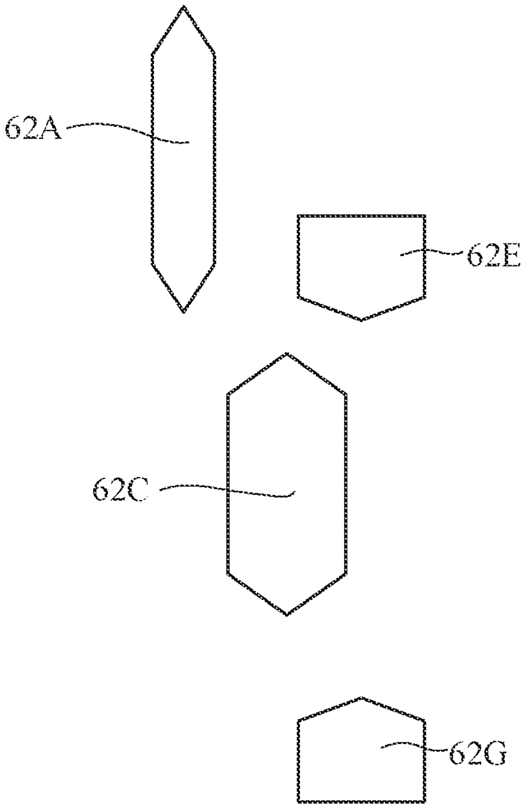
FIG. 16A is a schematic plan view of a first repeating unit in a first display area of a display panel according to some exemplary embodiments of the present disclosure.
Figure 16B:
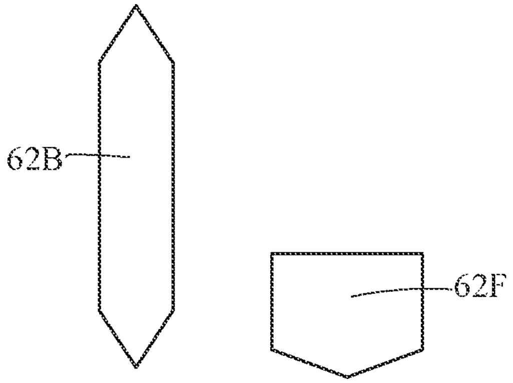
FIG. 16B is a schematic plan view of a second repeating unit in a second display area of the display panel according to some exemplary embodiments of the present disclosure.
Figure 16C:
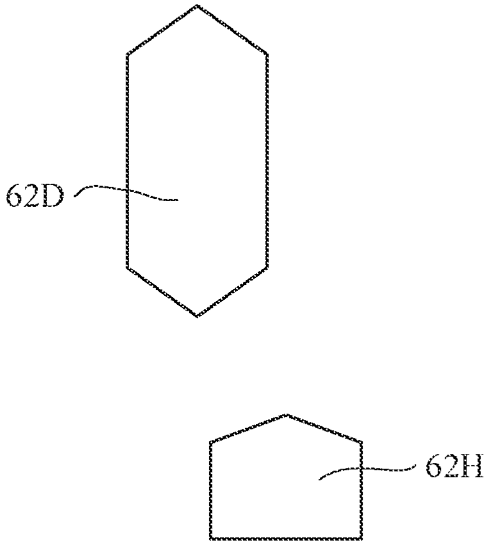
FIG. 16C is a schematic plan view of a third repeating unit in a second display area of the display panel according to some exemplary embodiments of the present disclosure.

FIG. 15 is a schematic plan view of a display panel according to some exemplary embodiments of the present disclosure. FIG. 16A is a schematic plan view of a first repeating unit located in the first display area of a display panel according to some exemplary embodiments of the present disclosure, and FIG. 16B is a schematic plan view of a second repeating unit located in a second display area of the display panel according to some exemplary embodiments of the present disclosure. FIG. 16C is a schematic plan view of a third repeating unit located in a second display area of a display panel according to some exemplary embodiments of the present disclosure. In order to clearly show the shape and size of the opening, only the opening of each sub-pixel is shown in FIGS. 16A to 16C, and other structures are omitted.

The special features of the embodiments will be described below in conjunction with FIGS. 15 and 16A to 16C. It should be understood that other structures and features of the embodiments can be referred to the above description.

Referring to FIG. 15, the display panel includes a plurality of repeating units arranged in an array in the row direction X and in the column direction Y. Some repeating units P1 (i.e., the first repeating units) are located in the first display area AA1, and some repeating units (including the second repeating units P2 and the third repeating units P3) are located in the second display area AA2.

The first repeating unit P1 may include a first sub-pixel SP1, a third sub-pixel SP3, a fifth sub-pixel SP5, and a seventh sub-pixel SP7. The second repeating unit P2 may include a second sub-pixel SP2 and a sixth sub-pixel SP6, and the third repeating unit may include a fourth sub-pixel SP4 and an eighth sub-pixel SP8.

Referring to FIG. 15, a plurality of first repeating units P1 are arranged in an array in the row direction X and in the column direction Y, and a plurality of second repeating units P2 are arranged in an array in the row direction X and in the column direction Y, and a plurality of third repeating units P3 is arranged in an array in the row direction X and in the column direction Y. The distribution density of the first repeating units P1 is greater than the distribution density of the second repeating units P2, and the distribution density of the first repeating units P1 is greater than the distribution density of the third repeating units P3.

Rows where the second repeating units P2 are located and rows where the third repeating unit P3 are located are alternately arranged in the column direction Y. Columns where the second repeating units P2 are located and columns where the third repeating unit P3 are located are spaced apart in the row direction X, by a spacing distance that is substantially equal to the size of one first repeating unit P1 in the row direction X.

For one second repeating unit P2, the second sub-pixel SP2 and the sixth sub-pixel SP6 are respectively located in two adjacent sub-pixel columns. For one third repeating unit P3, the fourth sub-pixel SP4 and the eighth sub-pixel SP8 are respectively located in two adjacent sub-pixel columns.

The second sub-pixels SP2 of the second repeating unit P2 and the first sub-pixels SP1 of some first repeating units P1 are located in the same column. The sixth sub-pixels SP6 of the second repeating unit P2 are located in the same column as the fifth sub-pixels SP5 and the seventh sub-pixels SP7 of some first repeating units P1. The fourth sub-pixels SP4 of the third repeating unit P2 and the third sub-pixels SP3 of some first repeating units P1 are located in the same column. The eighth sub-pixels SP8 of the third repeating unit P3 are located in the same column as the fifth sub-pixels SP5 and the seventh sub-pixels SP7 of some first repeating units P1.

Continue to refer to FIG. 15, the display panel further includes a plurality of spacers. For the convenience of description, the spacer located in the first display area AA1 is described as a first spacer PS1, and the spacer located in the second display area AA2 is described as a second spacer PS2.

A plurality of first spacers PS1 are arranged in an array in the row direction X and in the column direction Y in the first display area AA1, and a plurality of second spacers PS2 are arranged in an array in the row direction X and in the column direction Y in the second display area AA2. The distribution density of the first spacers PS1 is greater than the distribution density of the second spacers PS2. For example, the distribution density of the second spacers PS2 can be about 1/6 to 1/3 of the distribution density of the first spacers PS1. For example, as shown in FIG. 15, the distribution density of the second spacers PS2 can be about 1/6 of the distribution density of the first spacers PS1.

The second spacers PS2 are only arranged in the area where the second repeating units P2 are located, that is, no second spacer PS2 is arranged in the light-transmitting area TRA where no second repeating unit P2 is provided.

For example, the number of second spacers PS2 is not greater than the number of second repeating units P2.

Optionally, the number of second spacers PS2 can be equal to the number of second repeating units P2, for example, only one second spacer PS2 is provided in each second repeating unit P2. Optionally, as shown in FIG. 15, the number of second spacers PS2 can be less than the number of second repeating units P2, for example, only one second spacer PS2 is provided in each of some second repeating units P2, and no second spacer PS2 is provided in other second repeating units P2.

Referring to FIGS. 16A to 16C, in the embodiments of the present disclosure, the area of the orthographic projection of the second opening 62B on the base substrate 1 is greater than the area of the orthographic projection of the first opening 62A on the base substrate 1.

The area of the orthographic projection of the fourth opening 62D on the base substrate 1 is greater than the area of the orthographic projection of the third opening 62C on the base substrate 1.

The area of the orthographic projection of the sixth opening 62F on the base substrate 1 is greater than the area of the orthographic projection of the fifth opening 62E on the base substrate 1.

The area of the orthographic projection of the eighth opening 62H on the base substrate 1 is greater than the area of the orthographic projection of the seventh opening 62G on the base substrate 1.

That is to say, the opening of each sub-pixel in the second repeating unit P2 and the third repeating unit P3 is enlarged outwardly with respect to the opening of each corresponding sub-pixel in the first repeating unit P1. For the detailed description of outward enlargement, please refer to the above description in conjunction with FIG. 1 to FIG. 8B, which is not repeated here.

In this way, the display uniformity between the first display area and the second display area can be further improved, and the uniformity between the lifetime of the light-emitting material of each sub-pixel located in the first display area and the second display area can be improved. In the above embodiments, rectangles, hexagons, and pentagons are taken as examples to describe each sub-pixel. However, the embodiments of the present disclosure are not limited to these shapes. For example, the shape of the orthographic projection of the sub-pixel on the base substrate may include but is not limited to the following shapes: trapezoid, rhombus, circle, ellipse, approximate rectangle, etc., wherein the approximate rectangle includes, for example, a rounded rectangle, but is not limited thereto. Correspondingly, the shape of the orthographic projection of the opening of each sub-pixel on the base substrate may include but is not limited to the following shapes: rectangle, hexagon, pentagon, trapezoid, rhombus, circle, ellipse, approximate rectangle, etc.

It should be noted that in the above embodiments, the shape of the spacer in the plan view is shown as a rectangular shape, but the embodiments of the present disclosure are not limited to this, and the shape of the spacer in the plan view may also be other shapes, such as circle, square, etc.

Referring back to FIG. 5, in some exemplary embodiments of the present disclosure, the above-mentioned pixel defining layer 6 can be made of one or more of the following materials: polyimide, silicon oxide, silicon nitride, and photoresist material. For example, one of the aforementioned materials can be used to separately form the pixel defining layer 6. Optionally, the pixel defining layer 6 can be composed of a stack of multiple films, each of which is formed of one or more of the aforementioned materials.

Figure 17:
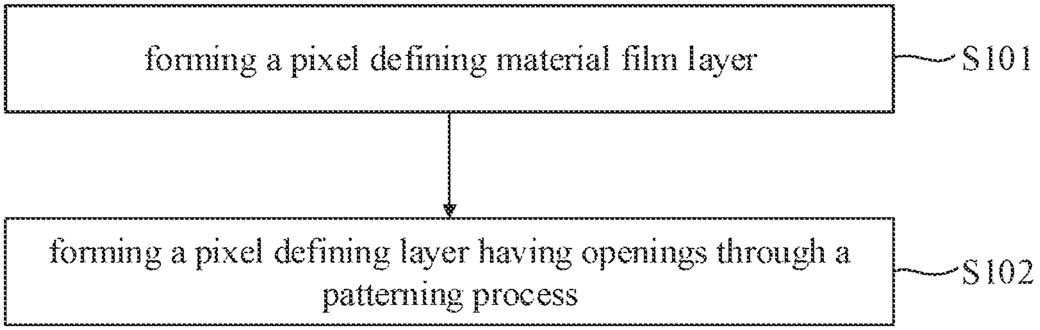
FIG. 17 is a flowchart of a method for manufacturing a pixel defining layer according to some exemplary embodiments of the present disclosure.

Referring to FIG. 17, in some exemplary embodiments of the present disclosure, the above-mentioned pixel defining layer 6 can be formed by the following manufacturing method.

In step S101, a pixel defining material film layer can be formed. For example, a film forming method such as coating, evaporation, sputtering, chemical vapor deposition, or the like can be used to form the pixel defining material film layer.

In step S102, the pixel defining layer 6 having the openings 62 can be formed through a patterning process.

For example, in the patterning process, photoresist can be coated, and then exposed and developed, and the exposed area corresponds to positions where the openings 62 are to be formed. Then, dry etching is performed to remove the pixel defining material at the exposed area to form the openings 62. Finally, the remaining photoresist is stripped off.

Optionally, if the pixel defining layer is made of photoresist material, in this step, it is also possible to choose not to perform dry etching.

Referring back to FIGS. 1 and 2, at least some embodiments of the present disclosure also provide a display device. The display device may include the display panel as described above and an image sensor 2 (such as a camera).

As described above, the display panel includes the first display area and the second display area, and the pixel density of the first display area is greater than the pixel density of the second display area. The image sensor 2 is located on a side of the base substrate 1 away from the pixel array, and a photosensitive surface of the image sensor 2 faces the display panel. An orthographic projection of the image sensor 2 on the base substrate 1 overlaps with an orthographic projection of the second display area AA2 on the base substrate 1, for example, falls within the orthographic projection of the second display area AA2 on the base substrate 1. Therefore, the light passing through the second display area can be used for imaging, thereby realizing the function of under-screen camera.

The image sensor 2 may adopt a structure known in the art, for example, including a complementary metal oxide semiconductor (CMOS) image sensor or a charge coupled device (CCD) image sensor. The image sensor 2 can be electrically connected to the image processor. In addition to the image sensor, in order to achieve a better imaging effect, an imaging module including the image sensor may also include a lens assembly, and the lens assembly and the image sensor can be arranged along an optical axis of the lens assembly in a direction perpendicular to the base substrate 1.

The display device may include any device or product with a display function. For example, the display device can be a smart phone, a mobile phone, an e-book reader, a desktop computer, a laptop computer, a netbook computer, a personal digital assistant (PDA), a portable multimedia player (PMP), a digital audio player, a mobile medical device, a camera, a wearable device (such as a head-mounted device, an electronic clothing, an electronic bracelet, an electronic necklace, an electronic accessory, an electronic tattoo, or a smart watch), a television, etc.

Although some embodiments of the general technical concept of the present disclosure have been shown and described, those of ordinary skill in the art will understand that changes can be made to these embodiments without departing from the principle and spirit of the general technical concept. The scope of the present disclosure shall be defined by the claims and their equivalents.

What is claimed is:

1. A display panel, the display panel comprising a first display area and a second display area, wherein the display panel comprises:

a base substrate;

a pixel defining layer, wherein the pixel defining layer is disposed on the base substrate and located in both the first display area and the second display area, and the pixel defining layer comprises a first opening located in the first display area and a second opening located in the second display area;

a plurality of first repeating units, wherein the plurality of first repeating units are arranged on the base substrate in an array in a row direction and a column direction and are located in the first display area, and each of the first repeating units comprises at least a first sub-pixel; and a plurality of second repeating units, wherein the plurality of second repeating units are arranged on the base substrate in an array in the row direction and the column direction and are located in the second display area, each of the second repeating units comprises at least a second sub-pixel, and a color of light emitted by the first sub-pixel is the same as a color of light emitted by the second sub-pixel, wherein a distribution density of the first repeating units in the first display area is greater than a distribution density of the second repeating units in the second display area;

wherein the first sub-pixel comprises the first opening, the second sub-pixel comprises the second opening, and an area of an orthographic projection of the second opening on the base substrate is greater than an area of an orthographic projection of the first opening on the base substrate; and wherein the display panel further comprises a plurality of spacers, the plurality of spacers comprise first spacers in the first display area and second spacers in the second display area, and a distribution density of the first spacers is greater than a distribution density of the second spacers.

2. The display panel according to claim 1, wherein:

the pixel defining layer further comprises a third opening in the first display area and a fourth opening in the second display area;

each of the first repeating units further comprises a third sub-pixel, each of the second repeating units further comprises a fourth sub-pixel, a color of light emitted by the third sub-pixel is the same as a color of light emitted by the fourth sub-pixel, and the color of the light emitted by the third sub-pixel is different from the color of the light emitted by the first sub-pixel; and the third sub-pixel comprises the third opening, the fourth sub-pixel comprises the fourth opening, and an area of an orthographic projection of the fourth opening on the base substrate is greater than an area of an orthographic projection of the third opening on the base substrate.

3. The display panel according to claim 2, wherein:
the pixel defining layer further comprises a fifth opening in the first display area and a sixth opening in the second display area;
each of the first repeating units further comprises a fifth sub-pixel, each of the second repeating units further comprises a sixth sub-pixel, a color of light emitted by the fifth sub-pixel is the same as a color of light emitted by the sixth sub-pixel, and the color of the light emitted by the fifth sub-pixel, the color of the light emitted by the first sub-pixel, and the color of the light emitted by the third sub-pixel are different from each other; and
the fifth sub-pixel comprises the fifth opening, the sixth sub-pixel comprises the sixth opening, and an area of an orthographic projection of the sixth opening on the base substrate is greater than an area of an orthographic projection of the fifth opening on the base substrate.

4. The display panel according to claim 2, wherein:
the pixel defining layer further comprises a fifth opening and a seventh opening which are both located in the first display area, and a sixth opening and an eighth opening which are both located in the second display area;
each of the first repeating units further comprises a fifth sub-pixel and a seventh sub-pixel, each of the second repeating units further comprises a sixth sub-pixel and an eighth sub-pixel, colors of light emitted by the fifth sub-pixel, the sixth sub-pixel, the seventh sub-pixel, and the eighth sub-pixel are the same as each other, and the color of the light emitted by the fifth sub-pixel, the color of the light emitted by the first sub-pixel, and the color of the light emitted by the third sub-pixel are different from each other; and
the fifth sub-pixel comprises the fifth opening, the sixth sub-pixel comprises the sixth opening, the seventh sub-pixel comprises the seventh opening, and the eighth sub-pixel comprises the eighth opening, a sum of areas of orthographic projections of the sixth opening and the eighth opening on the base substrate is greater than a sum of areas of orthographic projections of the fifth opening and the seventh opening on the base substrate.

5. The display panel according to claim 3, wherein:
the orthographic projection of each of the first opening, the second opening, the third opening, the fourth opening, the fifth opening, and the sixth opening on the base substrate is in a shape of a rectangle, and the rectangle has a first size in the row direction and a second size in the column direction; and
the first size of the second opening is greater than the first size of the first opening and the second size of the second opening is greater than the second size of the first opening; and/or, the first size of the fourth opening is greater than the first size of the third opening and the second size of the fourth opening is greater than the second size of the third opening; and/or, the first size of the sixth opening is greater than the first size of the fifth opening and the second size of the sixth opening is greater than the second size of the fifth opening.

6. The display panel according to claim 4, wherein:
the orthographic projection of each of the first opening, the second opening, the third opening, and the fourth opening on the base substrate is in a shape of a hexagon, and the hexagon has a first size in the row direction and a second size in the column direction; and
the first size of the second opening is greater than the first size of the first opening and the second size of the second opening is greater than the second size of the first opening; and/or, the first size of the fourth opening is greater than the first size of the third opening and the second size of the fourth opening is greater than the second size of the third opening.

7. The display panel according to claim 6, wherein:
the orthographic projection of each of the fifth opening, the sixth opening, the seventh opening, and the eighth opening on the base substrate is in a shape of a pentagon, and the pentagon has a first size in the row direction and a second size in the column direction; and
a sum of the first size of the sixth opening and the first size of the eighth opening is greater than a sum of the first size of the fifth opening and the first size of the seventh opening, and a sum of the second size of the sixth opening and the second size of the eighth opening is greater than a sum of the second size of the fifth opening and the second size of the seventh opening.

8. The display panel according to claim 4, wherein, in two adjacent rows of second repeating units, one second repeating unit in one row and another second repeating unit which is located in the other row and adjacent to the one second repeating unit are spaced apart from each other in the row direction, by a spacing distance that is substantially equal to a size of one first repeating unit in the row direction.

9. The display panel according to claim 8, wherein in the same row of second repeating units, two adjacent second repeating units are spaced apart from each other in the row direction, by a spacing distance that is substantially equal to a size of three first repeating units in the row direction.

10. The display panel according to claim 8, wherein, in one of the second repeating units, the sixth sub-pixel and the eighth sub-pixel are located in the same column and are arranged on both sides of the fourth sub-pixel in the column direction, the second sub-pixel, the fourth sub-pixel, and the sixth sub-pixel are sequentially arranged in the row direction, the second sub-pixel and the sixth sub-pixel are located in the same row, and the second sub-pixel, the fourth sub-pixel, and the eighth sub-pixel are sequentially arranged in the column direction.

11. The display panel according to claim 8, wherein, in one of the second repeating units, the sixth sub-pixel and the eighth sub-pixel are located in the same column, and are arranged on the same side of the fourth sub-pixel in the column direction, the sixth sub-pixel and the eighth sub-pixel are spaced apart from each other in the column direction, the sixth sub-pixel and the eighth sub-pixel are arranged on the same side of the second sub-pixel in the row direction, the second sub-pixel, the fourth sub-pixel, and the sixth sub-pixel are sequentially arranged in the row direction, and a combination of the sixth sub-pixel and the eight sub-pixel is located in the same row as the second sub-pixel, and the fourth sub-pixel and the second sub-pixel are sequentially arranged in the column direction.

12. The display panel according to claim 2, wherein:
the pixel defining layer further comprises a fifth opening and a seventh opening which are both located in the first display area, and a sixth opening located in the second display area;
each of the first repeating units further comprises a fifth sub-pixel and a seventh sub-pixel, each of the second repeating units further comprises a sixth sub-pixel, colors of light emitted by the fifth sub-pixel, the sixth sub-pixel and the seventh sub-pixel are the same as each other, and the color of light emitted by the fifth sub-pixel, the color of the light emitted by the first sub-pixel, and the color of the light emitted by the third sub-pixel are different from each other; and the fifth sub-pixel comprises the fifth opening, the sixth sub-pixel comprises the sixth opening, the seventh sub-pixel comprises the seventh opening, and an area of an orthographic projection of the sixth opening on the base substrate is greater than a sum of areas of orthographic projections of the fifth opening and the seventh opening on the base substrate.

13. The display panel according to claim 12, wherein, in one of the first repeating units, the fifth sub-pixel and the seventh sub-pixel are located in the same column, and the fifth opening and the seventh opening located in the same column are spaced apart from each other in the column direction; and wherein:

the pixel defining layer further comprises a portion between the fifth opening and the seventh opening in the column direction; and the area of the orthographic projection of the sixth opening on the base substrate is greater than a sum of areas of orthographic projections of the fifth opening, the seventh opening, and the portion of the pixel defining layer between the fifth opening and the seventh opening on the base substrate.

14. The display panel according to claim 12, wherein, two adjacent rows of second repeating units are spaced apart in the column direction by a spacing distance that is equal to a size of one second repeating unit in the column direction.

15. The display panel according to claim 14, wherein, in one of the second repeating units, the second sub-pixel, the sixth sub-pixel, and the fourth sub-pixel are located in the same row and are arranged in sequence in the row direction.

16. The display panel according to claim 12, wherein, in a plurality of first repeating units arranged close to an edge of the second display area, a structure which is recessed relative to the adjacent first sub-pixel and the adjacent third sub-pixel is formed at the fifth sub-pixel.

17. The display panel according to claim 2, wherein, each of the first repeating units further comprises a fifth sub-pixel and a seventh sub-pixel, and each of the second repeating units further comprises a sixth sub-pixel; and wherein:

the display panel further comprises a plurality of third repeating units, the third repeating units are arranged on the base substrate in an array in the row direction and the column direction, and are located in the second display area, each of the third repeating unit comprises a fourth sub-pixel and an eighth sub-pixel;

the distribution density of the first repeating units is greater than a distribution density of the third repeating units; and a row where the second repeating units are located and a row where the third repeating units are located are alternately arranged in the column direction, and a column where the second repeating units are located and a column where the third repeating units are located are spaced apart in the row direction by a spacing distance that is substantially equal to a size of one first repeating unit in the row direction.

18. The display panel according to claim 17, wherein:

the pixel defining layer further comprises a third opening, a fifth opening, and a seventh opening which are all located in the first display area, and a fourth opening, a sixth opening and an eighth opening which are all located in the second display area;

the third sub-pixel comprises the third opening, the fourth sub-pixel comprises the fourth opening, the fifth sub-pixel comprises the fifth opening, the sixth sub-pixel comprises the sixth opening, the seventh sub-pixel comprises the seventh opening, and the eighth sub-pixel comprises the eighth opening; and an area of an orthographic projection of the fourth opening on the base substrate is greater than an area of an orthographic projection of the third opening on the base substrate, and an area of an orthographic projection of the sixth opening on the base substrate is greater than an area of an orthographic projection of the fifth opening on the base substrate, and an area of an orthographic projection of the eighth opening on the base substrate is greater than an area of an orthographic projection of the seventh opening on the base substrate.

19. The display panel according to claim 1, wherein each sub-pixel comprises:

an anode between the base substrate and the pixel defining layer; and a light-emitting layer on a side of the pixel defining layer away from the base substrate, wherein each of the first opening and the second opening exposes a part of the anode, and a part of the light-emitting layer is filled in each of the first opening and the second opening to contact an exposed part of the anode; and wherein in one of the second repeating units, a minimum distance between edges of openings of two adjacent sub-pixels is greater than 4 microns.

20. The display panel according to claim 1, wherein the distribution density of the second spacers is ⅙ to ½ of the distribution density of the first spacers.

21. The display panel according to claim 1, wherein:

the second spacers comprise a first sub-spacer and a second sub-spacer; and the first sub-spacer is arranged between the second sub-pixel and the sixth sub-pixel, and the second sub-spacer is arranged on a side of the fourth sub-pixel and located in a column where the second sub-pixels are located in the column direction; or the first sub-spacer is arranged between the second sub-pixel and a combination of the sixth sub-pixel and the eighth sub-pixel, the second sub-spacer is arranged on a side of the fourth sub-pixel and is located in a column where the combination of the sixth sub-pixel and the eighth sub-pixel is located in the column direction.

22. The display panel according to claim 21, wherein:

in an oblique column direction at an oblique angle with respect to the column direction, the second spacers in the same oblique column are all one kind of the first sub-spacer and the second sub-spacer;

in two adjacent oblique columns of second spacers, one column comprises the first sub-spacers, and the other column comprises the second sub-spacers.

23. The display panel according to claim 1, wherein a light-transmitting area is provided between two of the plurality of second repeating units adjacent to each other, and the second spacers are only arranged in an area where the second repeating unit is located.

24. The display panel according to claim 3, wherein the colors of the light emitted by the first sub-pixel, the third sub-pixel, and the fifth sub-pixel are red, blue, and green, respectively.

25. A display device, comprising:

the display panel according to claim 1; and an image sensor, wherein the image sensor is located on a side of the base substrate away from the pixel defining layer, and an orthographic projection of the image sensor on the base substrate is located within an orthographic projection of the second display area on the base substrate.

* * * * *